(12) United States Patent
Zhai

(10) Patent No.: US 9,871,004 B2
(45) Date of Patent: Jan. 16, 2018

(54) LAMINATES OF INTEGRATED ELECTROMAGNETICALLY SHIELDABLE THIN INDUCTORS, CAPACITORS, AND SEMICONDUCTOR CHIPS

(71) Applicant: Suzhou Qing Xin Fang Electronics Technology Co., Ltd., Suzhou (CN)

(72) Inventor: Jerry Zhijun Zhai, Toronto (CA)

(73) Assignee: Suzhou Qing Xin Fang Electronics Technology Co., Ltd., Suzhou (CN)

( * ) Notice: Subject to any disclaimer, the term of this patent is extended or adjusted under 35 U.S.C. 154(b) by 0 days.

(21) Appl. No.: 14/956,655

(22) Filed: Dec. 2, 2015

(65) Prior Publication Data

US 2016/0172310 A1    Jun. 16, 2016

Related U.S. Application Data

(60) Provisional application No. 62/089,914, filed on Dec. 10, 2014.

(51) Int. Cl.
| | |
|---|---|
| *H01L 23/552* | (2006.01) |
| *H01L 49/02* | (2006.01) |
| *H03H 7/075* | (2006.01) |
| *H01F 17/04* | (2006.01) |
| *H03H 7/09* | (2006.01) |
| *H03H 1/00* | (2006.01) |

(52) U.S. Cl.
CPC ............ *H01L 23/552* (2013.01); *H01L 28/10* (2013.01); *H01L 28/40* (2013.01); *H03H 7/075* (2013.01); *H01F 17/04* (2013.01); *H01L 2924/0002* (2013.01); *H03H 7/09* (2013.01); *H03H 2001/0014* (2013.01); *H03H 2001/0085* (2013.01); *H03H 2001/0092* (2013.01)

(58) Field of Classification Search
None
See application file for complete search history.

(56) References Cited

U.S. PATENT DOCUMENTS

| 5,643,804 A | 7/1997 | Michio et al. |
| 5,866,943 A * | 2/1999 | Mertol .................. H01L 23/36 |
| | | 257/659 |
| 2001/0026864 A1 | 10/2001 | Naoya et al. |

(Continued)

OTHER PUBLICATIONS

International Search Report, PCT/US2015/063349, dated Mar. 31, 2016, pp. 4.

*Primary Examiner* — Whitney T Moore
*Assistant Examiner* — Herve Assouman
(74) *Attorney, Agent, or Firm* — BainwoodHuang

(57) ABSTRACT

Semiconductor chip laminates and inductive, capacitive, and electromagnetic shielding laminate structures that can be integrated together to form electronic circuits for use in systems and devices such as smartphones, tablet computers, notebook computers, wearable electronic devices, portable medical devices, servers, networking equipment, industrial equipment, etc. Fabrications of such integrated laminate structures can be modularized into four (4) types of laminates, namely, inductive laminates, capacitive laminates, electromagnetic shielding laminates, and semiconductor chip laminates, which can be vertically laminated together and/or integrated side-by-side with high density to produce the desired electronic circuits, systems, and devices.

27 Claims, 24 Drawing Sheets

(56) References Cited

U.S. PATENT DOCUMENTS

| | | | |
|---|---|---|---|
| 2002/0075116 A1* | 6/2002 | Peels | H01F 17/0013 336/200 |
| 2004/0021218 A1* | 2/2004 | Hayama | G06K 19/07749 257/700 |
| 2005/0051870 A1* | 3/2005 | Yamazaki | H01L 21/6835 257/531 |
| 2008/0003408 A1* | 1/2008 | Masai | H01F 17/0033 428/161 |
| 2009/0273884 A1* | 11/2009 | Shimizu | H01G 4/232 361/306.1 |
| 2011/0068433 A1* | 3/2011 | Kim | H01L 23/552 257/531 |
| 2011/0237001 A1* | 9/2011 | Hasebe | H01L 25/0657 438/4 |
| 2012/0121919 A1 | 8/2012 | Nielsen | |
| 2012/0313743 A1 | 12/2012 | Kazunari et al. | |
| 2013/0038419 A1 | 2/2013 | Tomomi et al. | |
| 2013/0056847 A1* | 3/2013 | Chen | H01L 28/10 257/531 |
| 2014/0266546 A1* | 9/2014 | Mao | H01F 27/2804 336/200 |
| 2014/0312458 A1* | 10/2014 | Ashrafzadeh | H01L 23/3121 257/531 |

\* cited by examiner

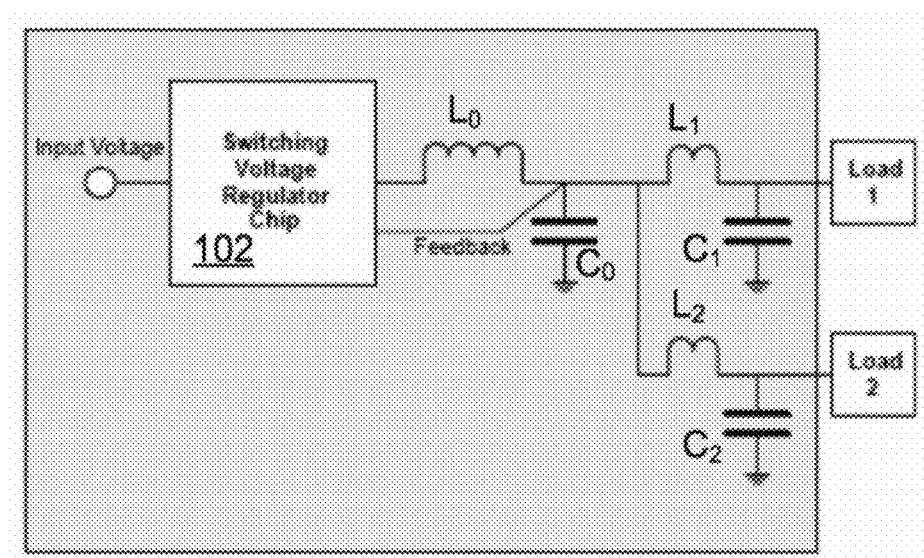
FIG. 1 – Prior art

LAMINATES OF INTEGRATED ELECTROMAGNETICALLY SHIELDABLE THIN INDUCTORS, CAPACITORS, AND SEMICONDUCTOR CHIPS

CROSS REFERENCE TO RELATED APPLICATIONS

This application claims benefit of the priority of U.S. Provisional Patent Application No. 62/089,914 filed Dec. 10, 2014 entitled METHODS AND DEVICES OF LAMINATED INTEGRATIONS OF SEMICONDUCTOR CHIPS, MAGNETICS, AND CAPACITANCE.

TECHNICAL FIELD

The present application relates generally to integrated laminate structures for use in electronic circuits, systems, and devices, and more specifically to semiconductor chip laminates and capacitive, inductive, and electromagnetic shielding laminate structures that can be integrated together to form electronic circuits for use in systems and devices such as smartphones, tablet computers, notebook computers, wearable electronic devices, portable medical devices, servers, networking equipment, industrial equipment, etc., and to methods of fabricating such integrated laminate structures and electronic circuits, systems, and devices.

BACKGROUND

Capacitors, magnetic or inductive components such as inductors and transformers, and semiconductor devices are typically employed in electronic circuits, systems, and devices such as switching power supplies, switching voltage regulators, isolated power converters, power factor correction converters, filters in linear voltage regulators, analog integrated circuits (ICs), radio frequency (RF) transmitters, micro-electro-mechanical systems (MEMS), sensors, etc. The capacitors and magnetic/inductive components are typically incorporated into such electronic circuits, systems, and devices as discrete components. The discrete capacitors and magnetic/inductive components and the semiconductor devices can be interconnected on printed circuit boards (PCBs) or packaged onto substrate carriers, which can be implemented using metal lead frames or circuits on isolated base plates or substrates.

The use of discrete capacitors and magnetic/inductive components in such electronic circuits, systems, and devices has several drawbacks, however. For example, the discrete capacitors and magnetic/inductive components can occupy large areas on a PCB or substrate carrier. The discrete capacitors and magnetic/inductive components can also be high in profile, and therefore may not be well suited for use in low profile electronic devices such as wearable electronic devices, tablet computers, smartphones, notebook computers, and portable medical devices.

The interconnections between the discrete capacitors and magnetic/inductive components and the semiconductor devices can also occupy large areas on the PCB or substrate carrier. Parasitic inductance and capacitance distributed throughout the interconnections can also prevent electronic circuits, systems, and devices from functioning properly in high frequency (e.g., from megahertz (MHz) to gigahertz (GHz)) applications. The discrete capacitors can also have mechanical outline connections or terminals that introduce parasitic inductance while operating in the radio frequency (e.g., MHz) range. As a result, the effective capacitance of the discrete capacitors can be reduced and the impedance increased as the operating frequency rises above about a few hundred MHz.

In addition, wire-wound types of discrete inductive components often generate acoustic noise that can be sensed by human ears as the operating frequency dynamically changes within the range of several hertz to 20 kilohertz (KHz). Wire-wound magnetic components, such as inductors, coupled inductors, and transformers, also generally have large air spaces or gaps between coil turns, as well as between the coil windings and a magnetic core, which require large areas on the PCB or substrate carrier. The structure of such wire-wound magnetic components can also exhibit mechanical vibrations and generate acoustic noise that can be sensed by human ears.

Moreover, because it is generally difficult to test discrete capacitors and magnetic/inductive components and trim them properly when incorporated with semiconductor devices into such electronic circuits, systems, and devices, the discrete capacitors, discrete magnetic/inductive components, and semiconductor devices are typically tested separately. As a result, it can be difficult if not impossible to optimize such electronic circuits, systems, and devices due to variations in the tolerance and/or accuracy of the discrete capacitors and magnetic/inductive components incorporated therein.

FIG. 1 depicts a conventional voltage regulator and voltage delivery circuit 100 formed using discrete capacitors and magnetic/inductive components, and a semiconductor device. As shown in FIG. 1, the voltage regulator and voltage delivery circuit 100 includes a switching voltage regulator chip 102, a discrete inductor $L_0$ and capacitor $C_0$ forming a first LC filter (the "$L_0C_0$ filter"), a discrete inductor $L_1$ and capacitor $C_1$ forming a second LC filter (the "$L_1C_1$ filter"), and a discrete inductor $L_2$ and capacitor $C_2$ forming a third LC filter (the "$L_2C_2$ filter"). The $L_0C_0$ filter is connected between the switching voltage regulator chip 102 and each of the $L_1C_1$ filter and the $L_2C_2$ filter. The $L_1C_1$ filter is connected to a load 1, and the $L_2C_2$ filter is connected to a load 2. The load 1 and load 2 represent devices that require a supply voltage with low voltage ripple and low voltage noise. The $L_0C_0$ filter and the $L_1C_1$ filter form a 2-stage LC filter that attenuates the voltage ripple to a required level for the load 1. Similarly, the $L_0C_0$ filter and the $L_2C_2$ filter form another 2-stage LC filter that attenuates the voltage ripple to the required level for the load 2.

However, the conventional voltage regulator and voltage delivery circuit 100 has drawbacks in that it requires three (3) discrete capacitors ($C_0$, $C_1$, $C_2$) and three (3) discrete inductors ($L_0$, $L_1$, $L_2$), in addition to the switching voltage regulator chip 102. The first stage $L_0C_0$ filter effectively chokes the pulse width modulation (PWM) voltage provided by the switching voltage regulator chip 102 to obtain a DC voltage, normally with a peak-to-peak voltage ripple of about 1 to 30 millivolts (mV). Because such voltage ripple in the mV range is generally too high for any precision circuits that might be included in the loads 1 and 2, the second stage $L_1C_1$ and $L_2C_2$ filters are employed to further attenuate the voltage ripples down to several microvolts (μV). The inductors $L_1$, $L_2$ in the second stage LC filters are typically ferrite beat or RF magnetic inductors to provide impedance in the high frequency range. If a separate channel output for the load 2 is desired, then another discrete inductor and capacitor forming a fourth LC filter would be required, further increasing the area necessary to implement the conventional voltage regulator and voltage delivery circuit 100.

SUMMARY

In accordance with the present application, semiconductor chip laminates and capacitive, inductive, and electromagnetic shielding laminate structures are disclosed that can be integrated together to form electronic circuits for use in systems and devices such as smartphones, tablet computers, notebook computers, wearable electronic devices, portable medical devices, servers, networking equipment, industrial equipment, etc. The integrated laminate structures are physically small in size and low in height profile, and can be used to provide low voltage ripple and high noise shielding immunity in applications including, but not limited to, linear or switching regulators, multiple output power management integrated circuits (PMICs) and power management units (PMUs), low-noise supply voltage for integrated circuits (ICs) such as analog-to-digital converters (ADCs), digital-to-analog converters (DACs), operational amplifiers, micro-electro-mechanical systems (MEMS), sensors, radio frequency (RF) ICs such as phase locked loops (PLLs), voltage controlled oscillators (VCOs), high speed clocks, voltage controlled oscillators, power amplifiers, transmitters, and isolated DC-DC and AC-DC power converters.

Methods of fabricating such integrated laminate structures are further disclosed that include vertically laminating multiple layers including semiconductor chips, magnetic layers, capacitive layers, conductive layers, and/or insulative layers, thereby integrating virtually all of the necessary components for an electronic system. The disclosed fabrication method can be used to produce electronic circuits, systems, and devices with reduced size and height, both of which are typically limited in portable and wearable device applications. Fabrications of the integrated laminate structures can be modularized into four (4) types of laminates, namely, inductive laminates, capacitive laminates, electromagnetic shielding laminates, and semiconductor chip laminates. Some or all of these modular laminate structures can be vertically laminated together and/or integrated side-by-side with high density to produce a final electronic circuit, system, or device. During production, the respective modular laminate structures can be fabricated in parallel before the modular laminate structures are assembled together, thereby reducing the fabrication cycle time.

In one aspect, an integrated laminate structure for use in an electronic system or device includes a plurality of modular laminate structures, or, more specifically, two or more of a modular inductive laminate structure, a modular capacitive laminate structure, a modular semiconductor chip laminate structure, and a modular electromagnetic shielding laminate structure. The plurality of modular laminate structures are integrated together to form at least part of at least one electronic circuit within the electronic system or device. In an exemplary aspect, the electronic circuit can be at least part of a linear voltage regulator, a step-down voltage regulation converter, a step-up voltage regulation converter, a buck-boost voltage converter, a supply voltage filter, a dual-phase interleaved voltage regulator, a flyback converter, a multiple output voltage regulator, a multi-stage inductor-capacitor filter, a power management unit (PMU), a power management integrator circuit (PMIC), a low noise voltage delivery system, or an integrated system battery charger.

Other features, functions, and aspects of the invention will be evident from the Detailed Description that follows.

BRIEF DESCRIPTION OF THE DRAWINGS

The accompanying drawings, which are incorporated in and constitute a part of this specification, illustrate one or more embodiments described herein and, together with the Detailed Description, explain these embodiments. In the drawings:

FIG. 1 is a schematic diagram of a conventional voltage regulator and voltage delivery circuit formed using discrete components;

FIG. 2-1(1) illustrates an exemplary stacked layer configuration of an inductive laminate, in accordance with the present application;

FIG. 2-1(2) illustrates an exemplary structure of the inductive laminate of FIG. 2-1(1);

FIG. 2-1(3) illustrates an exemplary coil winding and via structure on a top copper layer of the inductive laminate of FIG. 2-1(2);

FIG. 2-1(4) illustrates an exemplary coil winding and via structure on a bottom copper layer of the inductive laminate of FIG. 2-1(2);

FIG. 2-1(5) illustrates an exemplary cross-sectional view of magnetic component lamination, in accordance with the present application;

FIG. 2-1(6) illustrates an exemplary stacked layer structure of an inductive laminate with multiple magnetic layers, in accordance with the present application;

FIG. 2-1(7) illustrates an exemplary structure of the inductive laminate of FIG. 2-1(6);

FIG. 2-1(8) illustrates an equivalent circuit of an integrated inductor;

FIG. 2-1(9) illustrates an exemplary multiple coil winding pattern in a copper layer of an inductive laminate;

FIG. 2-1(10) illustrates an exemplary dual inductive component structure formed using a single magnetic core sheet layer;

FIG. 2-1(11) illustrates a cross-sectional view of an exemplary inductive laminate structure, including a plurality of vias formed through an insulative dielectric layer;

FIG. 2-1(12) illustrates another cross-sectional view of the inductive laminate structure of FIG. 2-1(11);

FIG. 2-1(13) illustrates a cross-sectional view of an exemplary inductive laminate structure that includes two or more inductive laminate sub-structures integrated side-by-side with high density;

FIG. 2-1(14) illustrates another cross-sectional view of the inductive laminate structure of FIG. 2-1(13);

FIG. 2-1(15) illustrates an exemplary electromagnetic shielding laminate, in accordance with the present application;

FIG. 2-2 illustrates an exemplary structure of a capacitive laminate, in accordance with the present application;

FIG. 2-3(1) illustrates an exemplary substrate base of a semiconductor chip laminate;

FIG. 2-3(2) illustrates an exemplary lamination of semiconductor chips in the substrate base of FIG. 2-3(1);

FIG. 2-3(3) illustrates an exemplary structure of a semiconductor chip laminate, in accordance with the present application;

FIG. 2-4(1) is an exemplary cross-sectional view of an electronic system incorporating integrated laminate structures, in accordance with the present application;

FIG. 2-4(2) illustrates an exemplary switching voltage regulator circuit that can be formed using the integrated laminate structures of FIG. 2-4(1);

FIG. 2-4(3) illustrates exemplary input and output pads for the electronic system of FIG. 2-4(1);

FIG. 2-4(4) illustrates another exemplary cross-sectional view of an electronic system incorporating integrated laminate structures, in accordance with the present application;

FIG. 2-4(5) illustrates still another exemplary cross-sectional view of an electronic system incorporating integrated laminate structures, in accordance with the present application;

FIG. 2-4(6) illustrates yet another exemplary cross-sectional view of an electronic system incorporating integrated laminate structures, including an electromagnetic shielding laminate, in accordance with the present application;

FIG. 2-4(7) illustrates still yet another exemplary cross-sectional view of an electronic system incorporating integrated laminate structures, in accordance with the present application;

FIG. 2-4(8) illustrates a further exemplary cross-sectional view of an electronic system incorporating integrated laminate structures, in accordance with the present application;

FIG. 3-1 is a schematic diagram for laminated system integration of an exemplary semiconductor chip and inductor;

FIG. 3-2 is a schematic diagram for laminated system integration of an exemplary semiconductor chip, inductor, and capacitor;

FIG. 3-3 is a schematic diagram for laminated system integration of an exemplary control circuit and inductor with discrete MOSFETs;

FIG. 3-4 is a schematic diagram for laminated system integration of an exemplary control circuit, low-side MOSFET, and inductor;

FIG. 3-5 is a schematic diagram for laminated system integration of an exemplary step-up converter;

FIG. 3-6 is a schematic diagram for laminated system integration of an exemplary step-up/step-down converter;

FIG. 3-7 is a schematic diagram for laminated system integration of an exemplary supply voltage filter for a semiconductor chip;

FIG. 3-8 is a schematic diagram for laminated system integration of an exemplary dual phase voltage regulator chip, coupled inductor, and capacitor;

FIG. 3-9 is a schematic diagram for laminated system integration of an exemplary flyback converter, including two semiconductor chips, a transformer, and a capacitor;

FIG. 3-10 is a schematic diagram for laminated system integration of an exemplary multiple output voltage regulator, power management unit (PMU), or power management integrated circuit (PMIC);

FIG. 3-11(1) is a schematic diagram for laminated system integration of an exemplary super low noise voltage regulator;

FIG. 3-11(2) is a diagram illustrating ultra low voltage ripples produced by the super low noise voltage regulator of FIG. 3-11(1);

FIG. 3-11(3) is a schematic diagram for laminated system integration of an exemplary multiple output voltage regulator with low noise;

FIG. 3-12 is a schematic diagram for laminated system integration of an exemplary system battery charger; and FIG. 4 is a flow diagram of an exemplary method of fabricating an electronic circuit for use in an electronic system or device, in accordance with the present application.

DETAILED DESCRIPTION

The disclosure of U.S. Provisional Patent Application No. 62/089,914 filed Dec. 10, 2014 entitled METHODS AND DEVICES OF LAMINATED INTEGRATIONS OF SEMICONDUCTOR CHIPS, MAGNETICS, AND CAPACITANCE is hereby incorporated herein by reference in its entirety.

Semiconductor chip laminates and inductive, capacitive, and electromagnetic shielding laminate structures are disclosed that can be integrated together to form electronic circuits for use in systems and devices such as smartphones, tablet computers, notebook computers, wearable electronic devices, portable medical devices, servers, networking equipment, industrial equipment, etc. As described herein, fabrications of such integrated laminate structures can be modularized into four (4) types of laminates, namely, inductive laminates, capacitive laminates, electromagnetic shielding laminates, and semiconductor chip laminates, which can be vertically laminated together and/or integrated side-by-side with high density to produce the desired electronic circuits, systems, and devices.

Inductive Laminates

In one embodiment, exemplary inductive laminates can include an inductor with a single winding, a coupled inductor with two or more interleaved windings, and a transformer with primary and secondary windings.

Structures and Features of Inductive Laminates

Figures 1, 2:
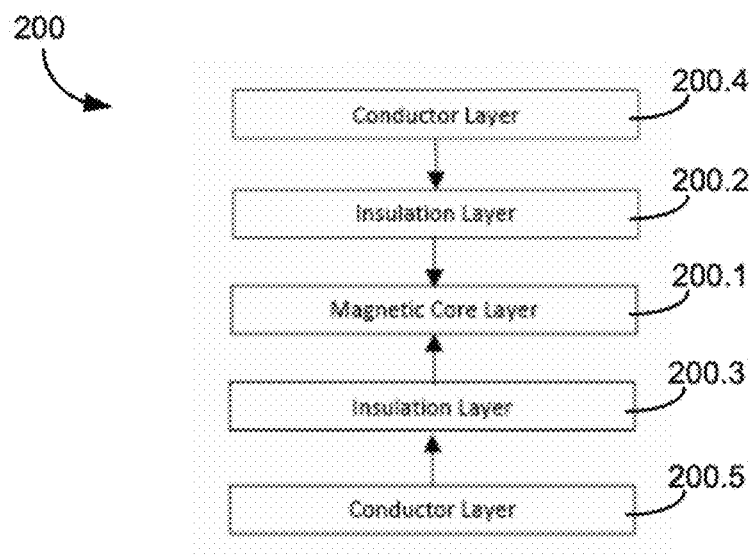
Figures 1, 2:
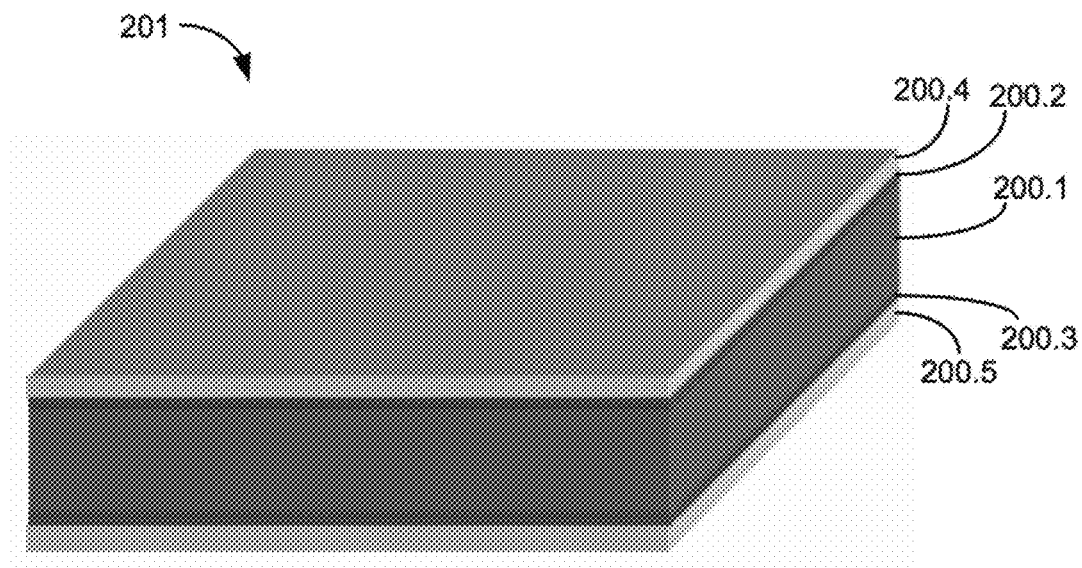
Figures 1, 2:
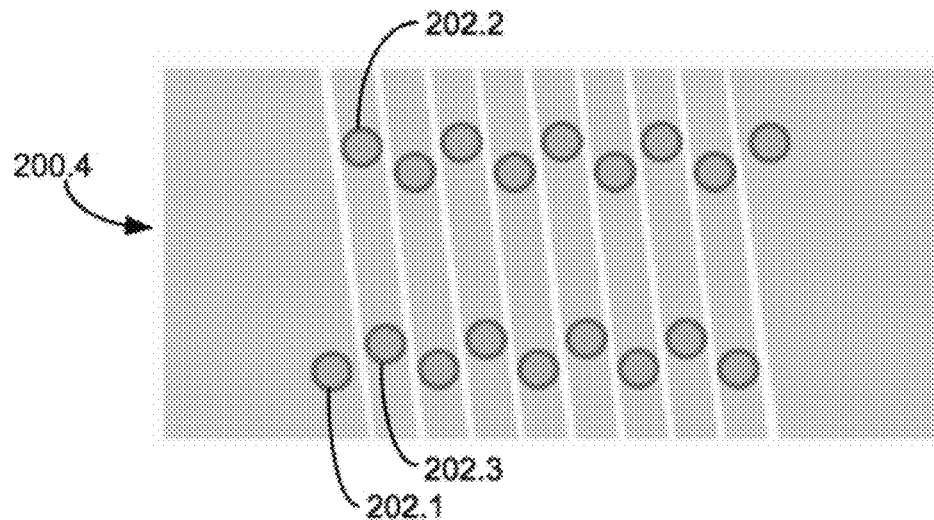
Figures 1, 2:
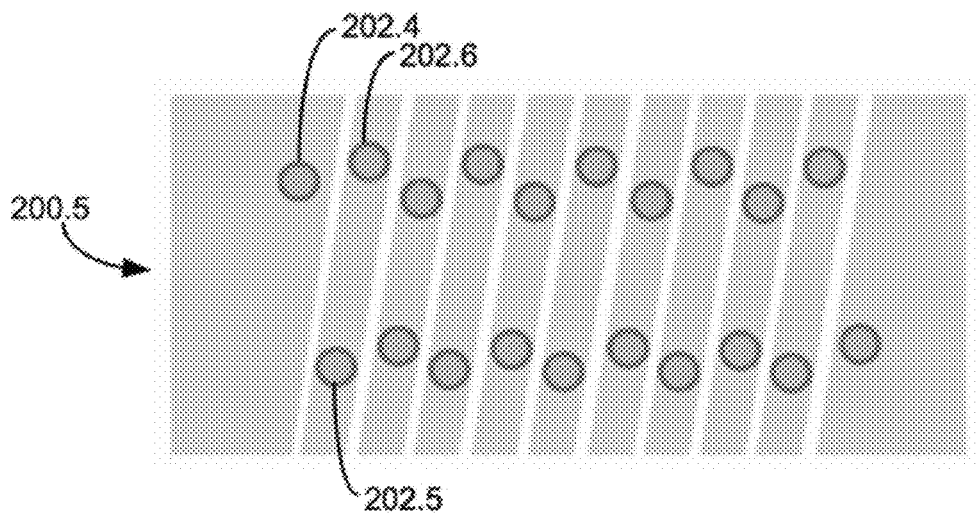
Figures 1, 2:
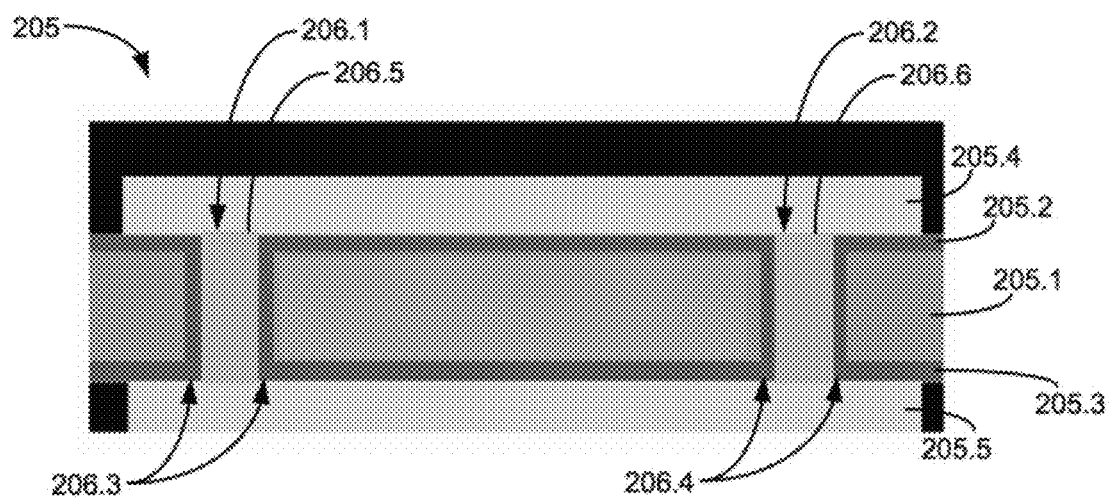
Figures 1, 2:
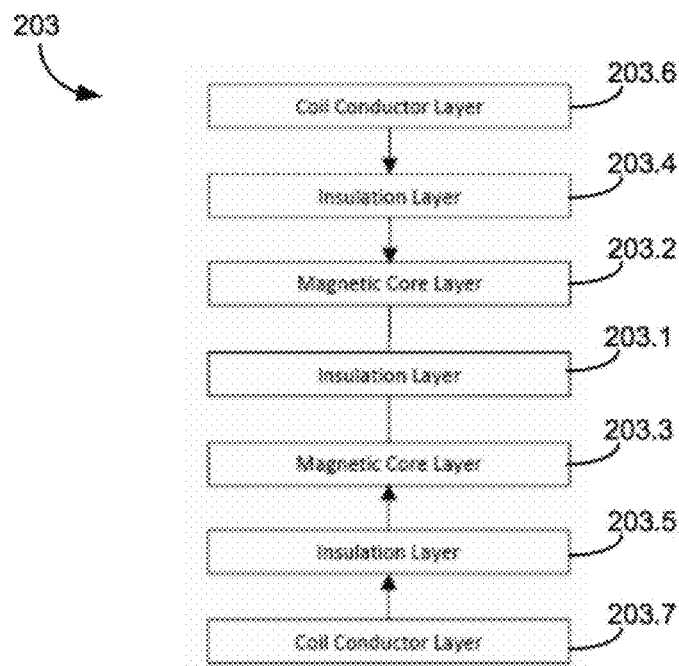
Figures 1, 2:
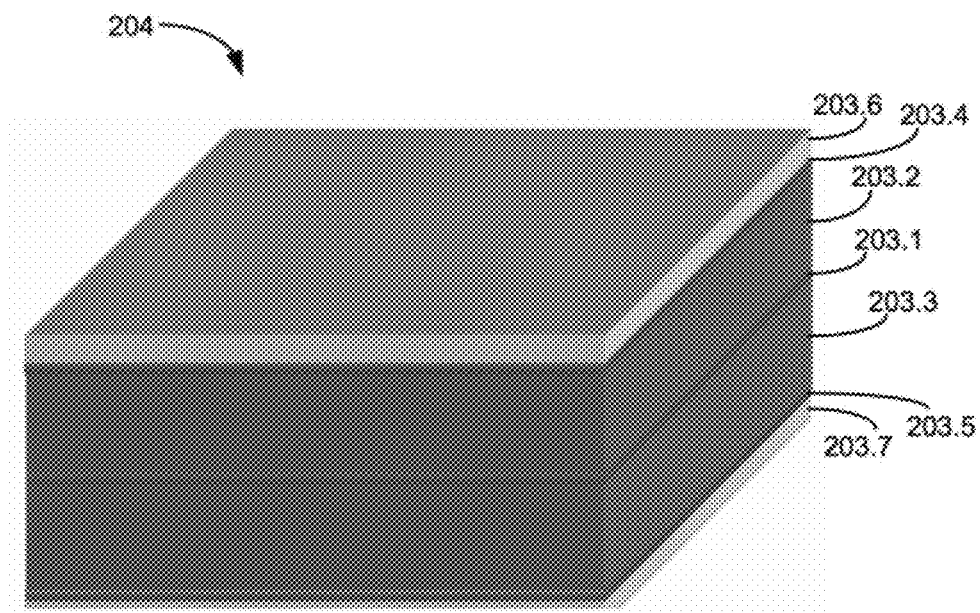
Figures 1, 2:
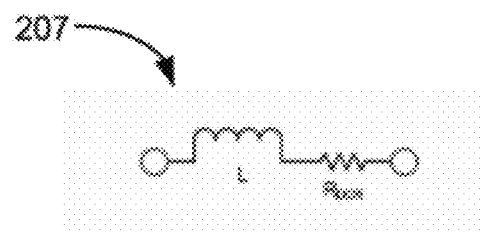
Figures 1, 2:
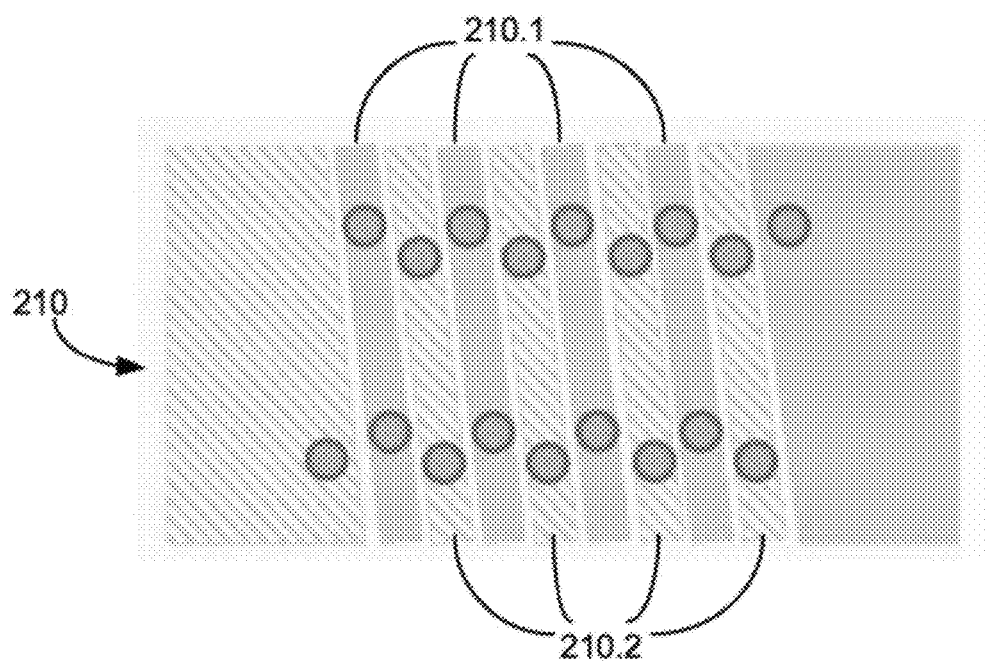
Figures 1, 2:
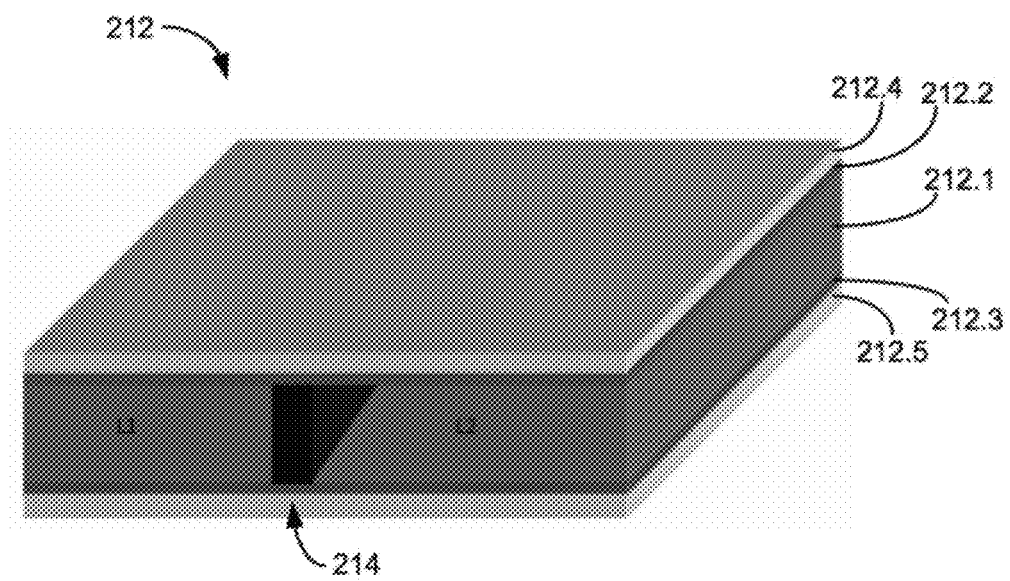
Figures 1, 2:
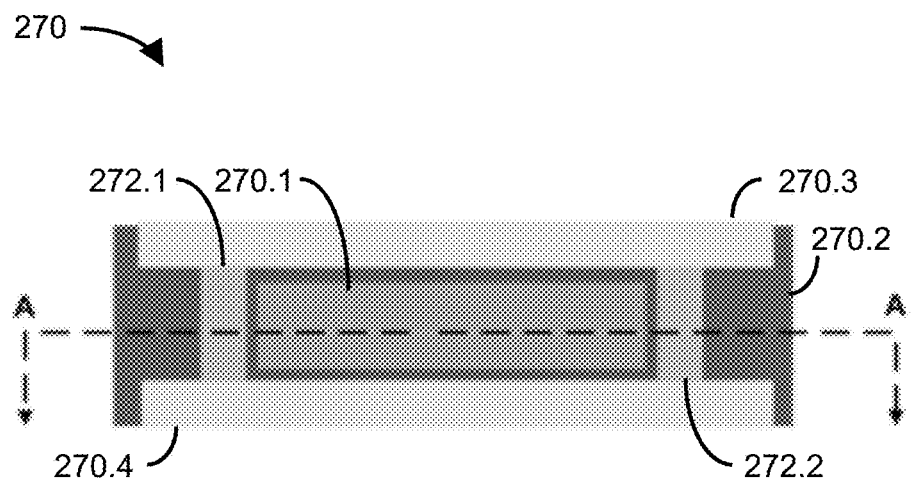
Figures 1, 2:
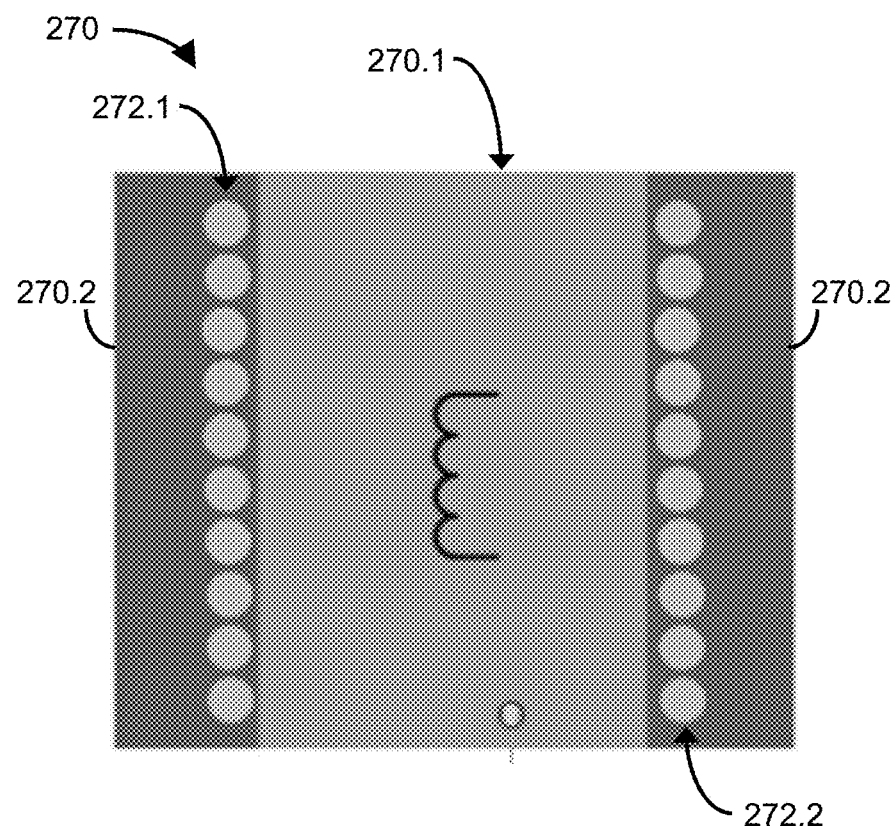
Figures 1, 2:
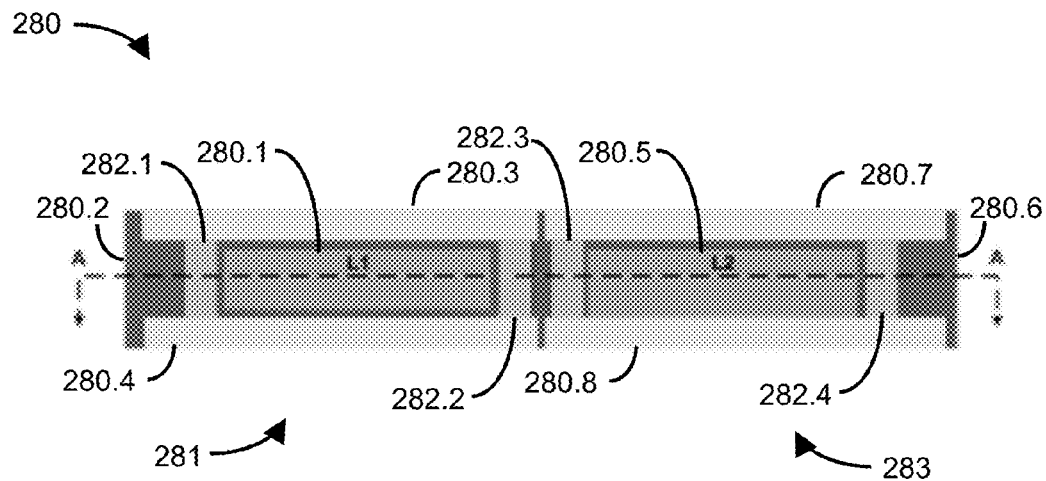
Figures 1, 2:
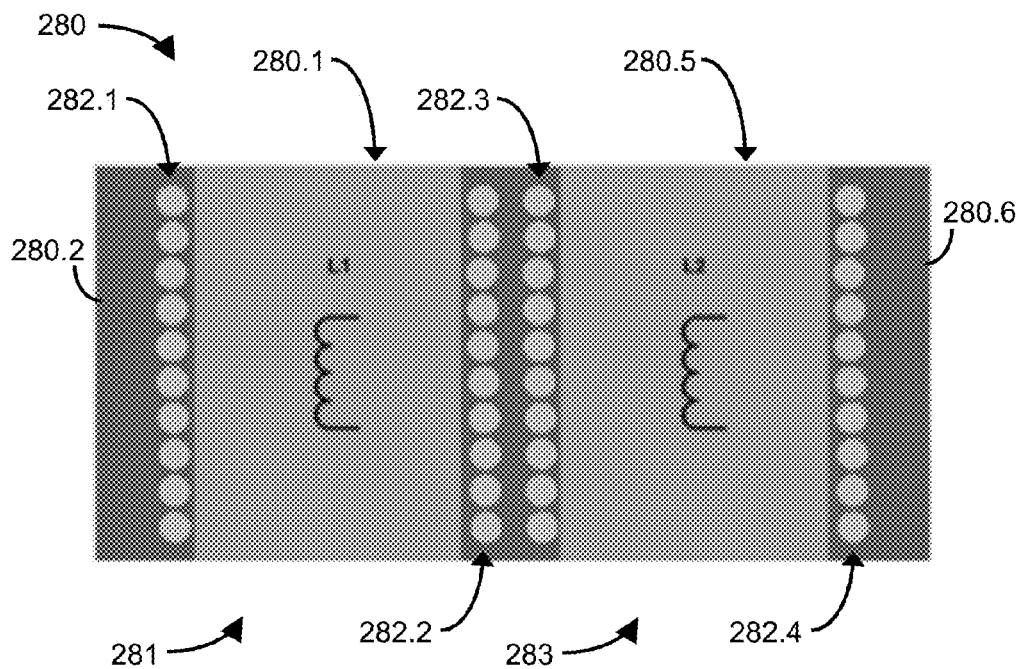
Figures 1, 2:
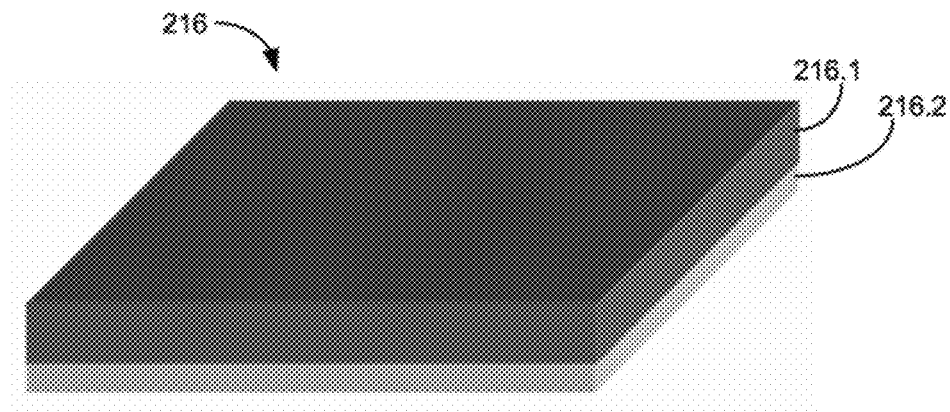
Figure 2:
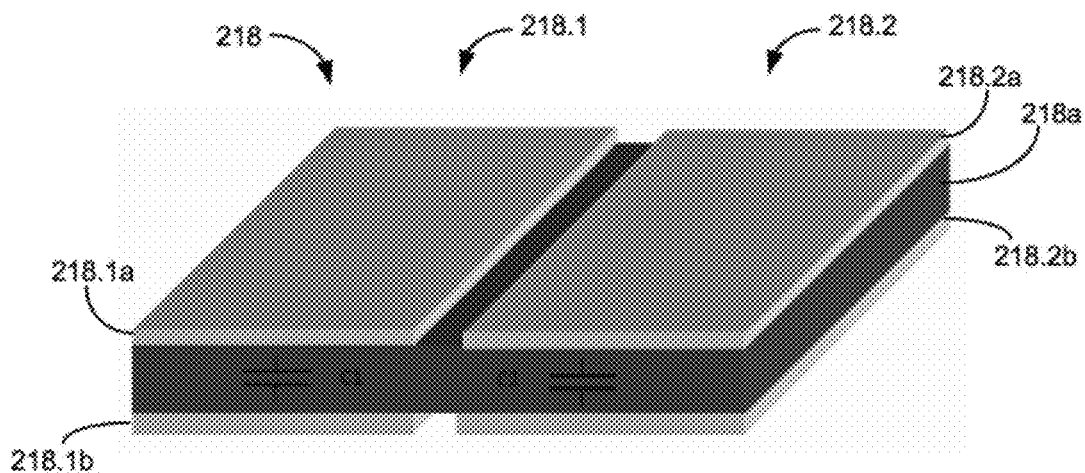

FIG. 2-1(1) illustrates an exemplary stacked layer configuration 200 of an inductive laminate, in accordance with the present application. As shown in FIG. 2-1(1), the stacked layer configuration 200 includes a magnetic core sheet layer 200.1, two insulation layers 200.2, 200.3, and two copper coil conductor layers 200.4, 200.5, which can be laminated together at a suitable profile of heat and pressure in a lamination process. Such a lamination process can be performed using substantially the same equipment used in printed circuit board (PCB) manufacturing.

In such a lamination process, small magnetic powder particles, which serve as the filler of the magnetic core sheet layer 200.1, are coated with isolative materials, and mixed in a binder resin to form a magnetic core sheet. Soft magnetic powder can be chosen in a number of alloy compositions, such as Sendust, Fe—Al—Si alloy, Ferrite, Mn—Zn alloy, Ni—Fe alloy, $C_O$—Nb—Zn alloy, or any other suitable alloy composition. The size of the magnetic particles in raw material films or flakes can have an influence on the frequency response of the electromagnetic properties of the stacked layer configuration 200. Polymer resin can be used to bind the magnetic particles together to form a sheet that has adequate tensile strength and flexural strength, as well as low thermal expansion coefficient after curing. The magnetic core sheet thickness can be in the range of about 10 μm to 2000 μm, or any other suitable range.

The surface of the magnetic core sheet layer 200.1 is normally electrically non-conductive, but it can be difficult to achieve reliable and stable insulation without introducing a complicated fabrication process. The two insulation layers 200.2, 200.3, which have a thermal setting capability (e.g., epoxy resin, FR4 pre-pregnant, bismaleimide-triazine (BT) resin, polyimide), can therefore be applied on opposite sides of the magnetic core sheet layer 200.1. The thickness of each insulation layer 200.2, 200.3 can be in the range of about 10 μm to 150 μm. The copper sheet layers 200.4, 200.5 are then placed on the top of the respective insulation layers 200.2, 200.3. The copper sheet layers 200.4, 200.5 can have a variable range of thickness from about 10 μm to 100 μm to reduce the resistance of the copper coils formed thereon, decreasing power losses and enhancing efficiency while current circulates through the magnetic components.

FIG. 2-1(2) illustrates an exemplary structure 201 of the inductive laminate of FIG. 2-1(1). As shown in FIG. 2-1(2), the inductive laminate structure 201 includes the magnetic core sheet layer 200.1, the two insulation layers 200.2, 200.3, and the two copper coil conductor layers 200.4, 200.5.

Coil conductors of the magnetic components can be etched out in designed patterns on the respective copper coil conductor layers 200.4, 200.5 (see FIG. 2-1(2)) to form the coil windings on the top layer 200.4 (see FIG. 2-1(3)) and on the bottom layer 200.5 (see FIG. 2-1(4)) of the inductive laminate. Further, a plurality of vias (e.g., vias 206.1, 206.2; see FIG. 2-1(5)) can be formed through the magnetic core sheet layer 200.1 to connect the windings on the top copper layer 200.4 to the windings on the bottom copper layer 200.5. As shown in FIGS. 2-1(3) and 2-1(4), multiple holes (such as holes 202.1, 202.2, 202.3, and holes 202.4, 202.5, 202.6) can be drilled from the top copper layer 200.4 to the bottom copper layer 200.5 in a double-hole-drilling process. After the first hole is drilled, insulated powder made of the same material as the insulation layers 200.2, 200.3 can be filled in the respective holes. A second hole can then be drilled inside the larger first hole with the same center point, but at a smaller diameter to maintain an insulation space (e.g., insulation spaces 206.3, 206.4; see FIG. 2-1(5)) between the two concentric first and second holes. A copper wall (e.g., a copper wall 206.5, 206.6; see FIG. 2-1(5)) can then be electroplated in the smaller second hole with a thickness in the range of about 12 μm to 35 μm, forming a conductive via between the patterned coil on the top copper layer 200.4 and the patterned coil on the bottom copper layer 200.5. As shown in FIGS. 2-1(3) and 2-1(4), each turn of the patterned coils can have one or more holes for vias on each side of the respective coil.

FIG. 2-1(5) illustrates a cross-sectional view of an exemplary structure 205 of an inductive laminate, including the plurality of vias 206.1, 206.2 formed through a magnetic core sheet layer 205.1. As shown in FIG. 2-1(5), the inductive laminate structure 205 includes the magnetic core sheet layer 205.1, two insulation layers 205.2, 205.3, and two copper coil conductor layers 205.4, 205.5. The copper walls 206.5, 206.6 are electroplated in holes drilled through the magnetic core sheet layer 205.1 to form the respective conductive vias 206.1, 206.2 between the two copper coil conductor layers 205.4, 205.5, and the insulation spaces 206.3, 206.4 are provided to separate the respective conductive vias 206.1, 206.2 from the magnetic core sheet layer 205.1. To reduce the resistance of the vias 206.1, 206.2 connecting the windings on the top copper layer 205.4 to the windings on the bottom copper layer 205.5, the holes (such as the holes 202.1-202.6; see FIGS. 2-1(3) and 2-1(4)) can be filled with conductive copper paste, which can make the via connections from the top copper layer 205.4 to the bottom copper layer 205.5 more solid while enhancing the mechanical strength of the inductive laminate structure 205.

It is noted that the electroplated copper wall of a respective via has a thermal conductivity of about 1000 times higher than the polymer based magnetic core 200.1 (see FIGS. 2-1(1) and 2-1(2)), whereas the conductive copper paste has a thermal conductivity about 10 times higher than the magnetic core 200.1. The solid via structures effectively reduce the electrical resistance and thermal resistance of the respective vias formed in the inductive laminate structure 201. The material in the vertical wall between the copper wall of a respective via and the magnetic core sheet layer 200.1 (e.g., epoxy resin, epoxy and bismaleimide-triazine (BT) blended resin, polyimide resin) has a dielectric capability to support a voltage of up to 5000 volts, depending upon the material property and wall thickness. The breakdown voltage can be high enough to meet the requirements of safety standards organizations such as Underwriters Laboratories (UL), Technischer Überwachungsverein (TÜV), Canadian Standards Association (CSA), or any other suitable safety standards organization.

It is further noted that, if the chosen copper sheet is thinner than the design target, then more copper can be added on the top surface of the respective copper conductor layers 200.4, 200.5 to increase the copper layer thickness to the targeted level. For example, an extrapolating process can be used for both the top and bottom sides of the respective layers 200.4, 200.5. The overall copper thickness can be in the range of about 10 μm to 200 μm. Copper traces of the patterned coils on the top and bottom copper layers 200.4, 200.5 can be extended close to the edges of the respective copper layer planes from the via centers. Most of the surface on both the top and bottom copper layers 200.4, 200.5 can be covered by the copper traces to increase the thermal conductivity of the inductive laminate structure 201 while reducing its rise in temperature during operation.

The two insulation layers 200.2, 200.3 can be made of epoxy resin, epoxy and bismaleimide-triazine (BT) blended resin, polyimide resin, or any other suitable material. A high-performance epoxy and pre-pregnant laminate has (1) a glass transition temperature, Tg, in the range of about 330° F. to 350° F., (2) a high dielectric capability to support electrical isolation, (3) high thermal properties to minimize z-axis expansion, and (4) high potential to prevent barrel cracking, all of which are beneficial for complex lamination designs. The blending of bismaleimide-triazine (BT) and epoxy resin provides enhanced thermal, mechanical, and electrical performance over standard epoxy systems. BT-epoxy possesses characteristics that make it a preferred selection for larger panel sizes. Its advantages include a high glass transition temperature, Tg, of about 385° F., a low coefficient of thermal expansion, and good electrical insulation in high humidity and at higher temperatures. Polyimide resin is also suitable for laminating magnetic sheet layers. Its thermal stability makes polyimide resin particularly attractive for applications with stringent high temperature requirements. A low coefficient of thermal expansion enhances plated-through-hole reliability in a wide temperature range.

Additional Structures and Features of Inductive Laminates

FIG. 2-1(6) illustrates an exemplary stacked layer configuration 203 of an inductive laminate with multiple magnetic core sheet layers. As shown in FIG. 2-1(6), the stacked layer configuration 203 includes an insulation layer 203.1, two magnetic core sheet layers 203.2, 203.3, two additional insulation layers 203.4, 203.5, and two copper coil conductor layers 203.6, 203.7, all of which can be laminated together at a suitable profile of heat and pressure in a lamination process.

FIG. 2-1(7) illustrates an exemplary structure 204 of the inductive laminate of FIG. 2-1(6). As shown in FIG. 2-1(7), the inductive laminate structure 204 includes the insulation layer 203.1, the two magnetic core sheet layers 203.2, 203.3, the two additional insulation layers 203.4, 203.5, and the two copper coil conductor layers 203.6, 203.7.

It is noted that the thickness of the magnetic core sheet layer(s) of the disclosed inductive laminate is variable. For example, when a large inductance is required, multiple layers (e.g., two or more) of the magnetic core sheets can be stacked up, as illustrated by the two magnetic core sheet layers 203.2, 203.3 in FIGS. 2-1(3) and 2-1(4). In the inductive laminate structure 204 of FIG. 2-1(7), the insulation layers 203.1, 203.4, 203.5 effectively bond the two magnetic core sheet layers 203.2, 203.3 together in the lamination process.

FIG. 2-1(8) is a schematic diagram of an equivalent circuit 207 of an inductor that can be formed as an inductive laminate. The dominant equivalent resistance, $R_{DCR}$ (see FIG. 2-1(8)), results from the etched coil pattern on the top and bottom copper layers, vias, and terminal connections of the inductive laminate. The equivalent inductance of the inductive laminate is represented by an inductor, L (see FIG. 2-1(8)). The dominant equivalent resistance, $R_{DCR}$, and the equivalent inductance, L, can vary from part-to-part due to tolerance variations in the fabrication process. An automatic testing machine in the fabrication process can be employed to test and measure $R_{DCR}$ and L, and trim the current detection circuits within a semiconductor chip that uses the voltage drop across the resistance $R_{DCR}$ as an input. Such trimming of semiconductor circuits, using information about the dominant equivalent resistance $R_{DCR}$ and the equivalent inductance L of the inductive laminate, can result in current measurement accuracy as high as +/−1%. In contrast, current measurement accuracy using conventional discrete inductor components and semiconductor devices is typically only about +/−7%.

It is noted that control circuitry within the semiconductor chip can use the information about the dominant equivalent resistance $R_{DCR}$ and the equivalent inductance L of the inductive laminate for a number of purposes. For example, the measured inductance L can be used in a control algorithm to achieve a fast dynamic response, to obtain an inductor peak current estimate, and to perform other functions of a power converter. Further, the voltage drop across the dominant equivalent resistance $R_{DCR}$ can be used to measure the average current, the peak current, and the ripple current of the inductor formed by the inductive laminate. It is further noted that the change of resistance of copper with temperature is linear, allowing temperature compensation to be incorporated with the current measurement to achieve a high level of accuracy across a wide range of temperature from about −40° C. to 240° C.

In addition, because the etched copper patterns in the magnetic coils of the inductive laminate are tightly adhered to the other layers of the laminate, there are essentially no mechanical vibrations in the copper coils. Integrated inductive components formed using the inductive laminate, such as inductors, coupled inductors, and transformers, therefore do not generate any acoustic noise that can be sensed or detected by human ears.

It is still further noted that the inductive laminate can have two or more windings that are coupled in the same electromagnetic field. FIG. 2-1(9) illustrates an exemplary coil and via structure 210 that includes multiple windings 210.1 and 210.2, which, for example, can be used to form a coupled inductor or a transformer. Insulation resin materials, such as epoxy, BT, or polyimide, can be used to fill the spaces between the windings 210.1, 210.2. Such insulation resin materials have the dielectric capability to satisfy isolation voltage requirements. By appropriately designing the spacing and structure of the windings 210.1, 210.2, the isolation voltage between the windings 210.1, 210.2 can be as high as 5000 volts to meet the safety standards required by Underwriters Laboratories (UL), Technischer Überwachungsverein (TÜV), Canadian Standards Association (CSA), or any other suitable safety standards organization.

Moreover, a single magnetic core sheet layer in the inductive laminate can be used to form two or more inductive components. FIG. 2-1(10) illustrates an exemplary dual inductive component structure 212 formed using a single magnetic core sheet layer 212.1. As shown in FIG. 2-1(10), the dual inductive component structure 212 includes the magnetic core sheet layer 212.1, two insulation layers 212.2, 212.3, and two copper coil conductor layers 212.4, 212.5. The magnetic core sheet layer 212.1 is etched to form a space 214 that separates two independent inductive laminate structures L1 and L2. Insulation resin materials, such as epoxy resin, or BT resin, can be used to fill the space 214 between the inductive laminate structures L1, L2. The width of the space 214 is dependent upon the permeability of the magnetic core sheet layer 212.1.

FIG. 2-1(11) illustrates a cross-sectional view of an exemplary inductive laminate structure 270, including a plurality of vias 272.1, 272.2 formed through an insulative dielectric layer 270.2. As shown in FIG. 2-1(11), the inductive laminate structure 270 further includes a magnetic core sheet layer 270.1 and two copper coil conductor layers 270.3, 270.4. For example, the insulative dielectric layer 270.2 can be made with BT, FR4, polyimide, or any other suitable material capable of supporting a range of voltage levels.

FIG. 2-1(12) illustrates a cross-sectional view of the inductive laminate structure 270 along the cross-sectional line A-A of FIG. 2-1(11), showing the magnetic core sheet layer 270.1, the insulative dielectric layer 270.2, and the plurality of vias 272.1, 272.2. As shown in FIG. 2-1(12), the magnetic core sheet layer 270.1 is substantially bar-shaped and embedded in the insulative dielectric layer 270.2. For example, the magnetic core sheet layer 270.1 can be pre-cut and/or diced to form the desired bar shape and placed in a cavity formed in the insulative dielectric layer 270.2, encapsulating the bar-shaped magnetic core sheet layer 270.1 within the insulative dielectric layer 270.2. The copper coil conductor layers 270.3, 270.4 can be electroplated or deposited on respective portions of the insulative dielectric layer 270.2 disposed on the top surface and on the bottom surface of the bar-shaped magnetic core sheet layer 270.1. Further, copper walls can be electroplated in holes drilled through the insulative dielectric layer 270.2 to form the respective conductive vias 272.1, 272.2 between the two copper coil conductor layers 270.3, 270.4, and conductive traces can be etched in the copper coil conductor layers 270.3, 270.4 to form multiple turns of a coil winding wrapped around the bar-shaped magnetic core sheet layer 270.1.

FIG. 2-1(13) illustrates a cross-sectional view of an exemplary inductive laminate structure 280 that can include two or more inductive laminate sub-structures 281, 283 integrated side-by-side with high density, in which each inductive laminate sub-structure 281, 283 is like the inductive laminate structure 270 of FIG. 2-1(11). As shown in FIG. 2-1(13), the inductive laminate sub-structure 281 includes a plurality of vias 282.1, 282.2 formed through an insulative dielectric layer 280.2. The inductive laminate sub-structure 281 further includes a magnetic core sheet layer 280.1 and two copper coil conductor layers 280.3, 280.4. Likewise, the inductive laminate sub-structure 283 includes a plurality of vias 282.3, 282.4 formed through an insulative dielectric layer 280.6, a magnetic core sheet layer 280.5, and two copper coil conductor layers 280.7, 280.8.

FIG. 2-1(14) illustrates a cross-sectional view of the inductive laminate structure 280 along the cross-sectional line A-A of FIG. 2-1(13), showing the magnetic core sheet layer 280.1, the insulative dielectric layer 280.2, and the plurality of vias 282.1, 282.2 of the inductive laminate sub-structure 281, as well as the magnetic core sheet layer 280.5, the insulative dielectric layer 280.6, and the plurality of vias 282.3, 282.4 of the inductive laminate sub-structure 283. The copper coil conductor layers 280.3, 280.4 can be electroplated or deposited on respective portions of the insulative dielectric layer 280.2 disposed on the top surface and on the bottom surface of the bar-shaped magnetic core sheet layer 280.1. Likewise, the copper coil conductor layers 280.7, 280.8 can be electroplated or deposited on respective portions of the insulative dielectric layer 280.6 disposed on the top surface and on the bottom surface of the bar-shaped magnetic core sheet layer 280.5. Copper walls can be electroplated in holes drilled through the insulative dielectric layer 280.2 to form the respective conductive vias 282.1, 282.2 between the two copper coil conductor layers 280.3, 280.4, and conductive traces can be etched in the copper coil conductor layers 280.3, 280.4 to form multiple turns of a first coil winding wrapped around the bar-shaped magnetic core sheet layer 280.1. Similarly, copper walls can be electroplated in holes drilled through the insulative dielectric layer 280.6 to form the respective conductive vias 282.3, 282.4 between the two copper coil conductor layers 280.7, 280.8, and conductive traces can be etched in the copper coil conductor layers 280.7, 280.8 to form multiple turns of a second coil winding wrapped around the bar-shaped magnetic core sheet layer 280.5. By symmetrically forming the bar-shaped magnetic core sheet layers 280.1, 280.5, as well as the first and second coil windings wrapped around the magnetic core sheet layers 280.1, 280.5, respectively, the high precision of the lamination process can assure good inductance matching between the laterally adjacent inductive laminate sub-structures 281, 283.

Fabrications of the integrated laminate structures can be modularized into four (4) types of laminates, namely, the inductive laminates, as well as capacitive laminates, electromagnetic shielding laminates, and semiconductor chip laminates. Some or all of these modular laminate structures can be vertically laminated together and/or integrated side-by-side with high density to produce electronic circuits, systems, or devices. During production, the respective modular laminate structures can be fabricated in parallel before the modular laminate structures are assembled together, thereby reducing the fabrication cycle time. With regard to the disclosed inductive laminates, the coil patterns and copper thicknesses can be specified within the fabrication process of the inductive laminate modules, without impacting any of the other laminates used in the same device. In this way, the design methodology of the inductive laminates can be optimized while lowering the design and fabrication risks.

Electromagnetic Shielding Laminates

Not only can the magnetic core sheet layer discussed herein be used to form inductive laminates, but it can also be used to form electromagnetic shielding laminates. Such a magnetic core sheet layer can be used to form a flux path for external electromagnetic noise and/or signals to flow through, preventing them from flowing further inside the laminated device. For example, the magnetic core sheet layer can achieve noise attenuation of up to several tens of gigahertz (GHz) frequency.

FIG. 2-1(15) illustrates an exemplary structure 216 of an electromagnetic shielding laminate, in accordance with the present application. As shown in FIG. 2-1(15), the electromagnetic shielding laminate structure 216 includes a magnetic core sheet layer 216.1, and a copper conductor layer 216.2. The magnetic core sheet layer 216.1 is similar to the magnetic core sheet layer used in the disclosed inductive laminate in that both include magnetic particles mixed in resin binders. The copper conductor layer 216.2 can be placed under the magnetic core sheet layer 216.1 to enhance the electromagnetic shielding effects, reducing eddy currents flowing through the device. When the external electromagnetic noise is strong, the thickness of the magnetic core sheet layer 216.1 can be increased to enhance the magnetic absorbing capability of the electromagnetic shielding laminate structure 216.

Capacitive Laminates

FIG. 2-2 illustrates an exemplary structure 218 of a capacitive laminate, in accordance with the present application. As shown in FIG. 2-2, the capacitive laminate structure 218 includes two capacitive component structures 218.1 ($C_1$), 218.2 ($C_2$) formed from a single capacitance core sheet layer 218a. The capacitive component structure 218.1 includes the capacitance core sheet layer 218a, and two copper conductor layers 218.1a, 218.1b. Similarly, the capacitive component structure 218.2 includes the capacitance core sheet layer 218a, and two copper conductor layers 218.2a, 218.2b. A first copper conductor sheet layer can be etched to form the two copper conductor layers 218.1a, 218.2a, and a second copper conductor sheet layer can be etched to form the two copper conductor layers 218.1b, 218.2b.

The capacitance core sheet layer 218a includes dielectric particles distributed in binders, which can be epoxy, BT, polyimide, or any other suitable material. The capacitance core sheet layer 218a has a dielectric constant in the range of about 3 to 40, depending upon the capacitance density requirements. The binder material that holds the dielectric particles together in the capacitance core sheet layer 218a can create a sufficient amount of adhesion with the respective copper conductor layers 218.1a, 218.1b, 218.2a, 218.2b under a suitable profile of heat and pressure.

It is noted that the copper conductor layers 218.1a, 218.1b, 218.2a, 218.2b can serve as terminals of the capacitive component structures 218.1 ($C_1$), 218.2 ($C_2$) for interconnecting the respective capacitive component structures with semiconductor chip or inductive laminates through one or more vias. The interconnections can be kept short to make any parasitic inductance in the interconnection routing small or negligible. Further, the dielectric constant of the capacitance core sheet layer 218a can be high and stable over a wide frequency response up to several tens of GHz. The capacitive laminate has (1) low impedance and provides high filtering performance in a wide frequency range up to about 20 GHz, (2) a density range of about 10 picofarads (pF) to 800 pF per square centimeter, depending upon the dielectric capability and thickness of the capacitance core sheet layer 218a, (3) extremely low thermal noise, and (4) high voltage supporting capability of up to 5000 volts to meet safety standards required by Underwriters Laboratories (UL), Technischer Überwachungsverein (TÜV), Canadian Standards Association (CSA), or any other suitable safety standards organization. The capacitive laminate also provides benefits when used in the filtering of high precision reference voltages and supply voltages for analog circuits, MEMS, sensors, and low-noise circuits.

The disclosed capacitive laminate can be used in applications including, but not limited to, the following: capacitance filters in switching and linear power supplies; supply voltage filters for high precision circuits or devices such as analog-to-digital converters (ADCs), digital-to-analog converters (DACs), operational amplifiers, barometer sensors, and gyro-motion sensors (when the capacitive laminate is used in a supply voltage filter, it provides a high power supply rejection ratio (PSRR) and low impedance in a frequency range of a few MHz to several tens of GHz); signal transmitting capacitance with a short delay time (e.g., less than a few nanoseconds) in applications such as high speed clocks, phase locked loops, and RF modulation; and, capacitance to support voltage isolation of up to 5000 volts between the primary side and the secondary side of transformers, as required by safety standards organizations such as Underwriters Laboratories (UL), Technischer Überwachungsverein (TÜV), Canadian Standards Association (CSA), or any other suitable safety standards organization. The capacitive laminate can also be used to provide signal isolation in current sense, voltage sense, and power meter applications of electrical systems.

Semiconductor Chip Laminates

Figures 2, 3:
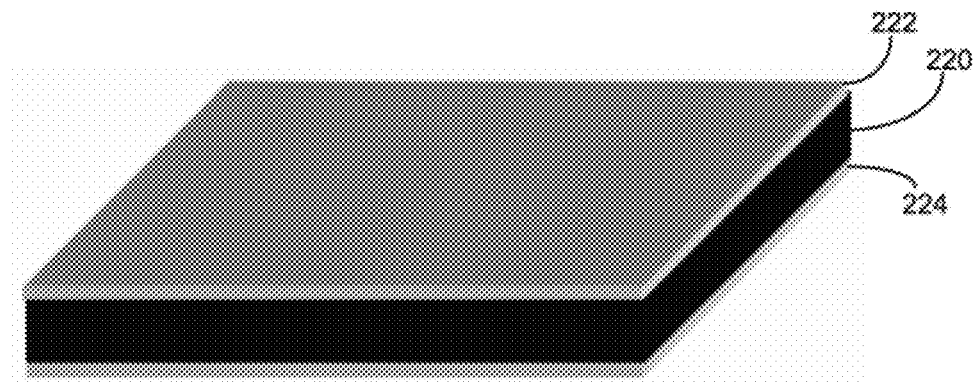
Figures 2, 3:
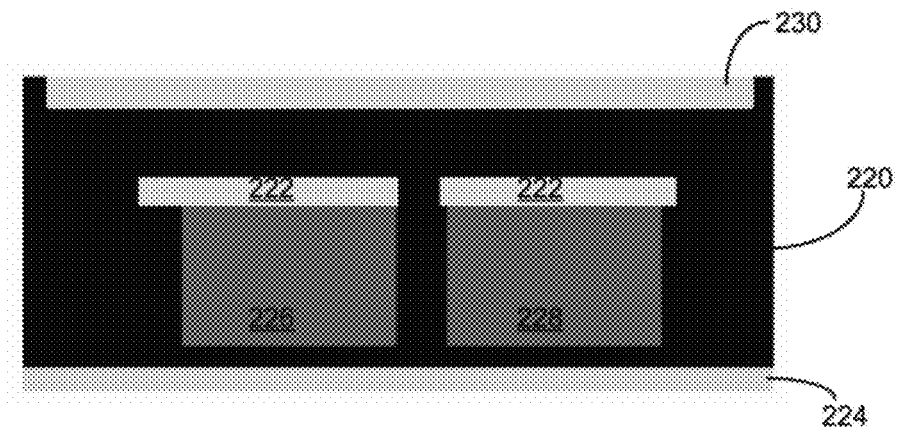
Figures 2, 3:
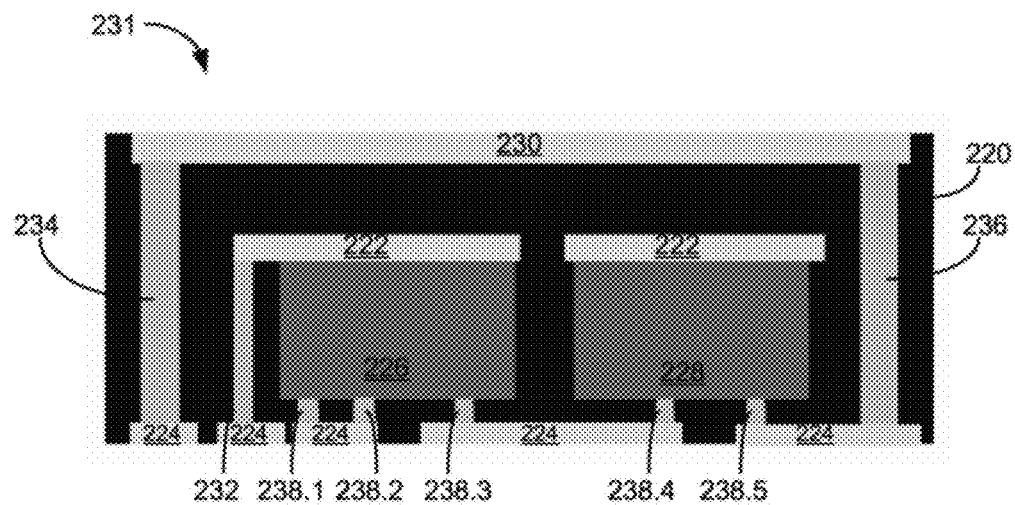

FIG. 2-3(1) depicts an exemplary substrate base 220 of a semiconductor chip laminate, with two copper conductor layers 222, 224 disposed on opposite sides of the substrate base 220. For example, the substrate base 220 can be made with BT, FR4, polyimide, or any other suitable material. The copper conductor layers 222, 224 on the respective sides of the substrate base 220 can be etched to make patterns required by the semiconductor chip interconnects.

As shown in FIG. 2-3(2), two or more semiconductor chips 226, 228 can be inserted in the substrate base 220, and conductive or non-conductive resin paste can be applied to adhere the semiconductor chips 226, 228 within the substrate base 220. Flexible films of pre-pregnant BT, FR4 or polyimide can also be placed in the empty spaces between the semiconductor chips 226, 228, and pressed on the semiconductor chips 226, 228 and the substrate base 220 under a suitable profile of pressure and heat. After applying such pressure and heat, the surfaces of the semiconductor chips 226, 228 can be fully covered by a thin layer of the film materials. Another layer 230 of copper can also be placed outside of the substrate base 220, as depicted in FIG. 2-3(2).

FIG. 2-3(3) depicts an exemplary structure 231 of a semiconductor chip laminate, in accordance with the present application. As shown in FIG. 2-3(3), the semiconductor chip laminate structure 231 includes the substrate base 220, the semiconductor chips 226, 228, and the copper conductor layers 222, 224, 230. Vias can be drilled between the copper conductor layers 222, 224 (e.g., a via 232), from the copper conductor layer 224 to the surfaces of the semiconductor chips 226, 228 (e.g., vias 238.1-238.5), as well as between the copper conductor layers 224, 230 (e.g., vias 234, 236) to make the required interconnections. To reduce the resistance of the respective vias 232, 234, 236, 238.1-238.5, conductive copper paste can be filled inside the via holes. Such a conductive copper paste has a thermal conductivity property that is about three to five times better than polymer resin such as epoxy, BT, FR4, and polyimide. The resulting solid vias help to enhance the thermal dissipation from the semiconductor chips 226, 228.

It is noted that all of the copper conductor layers (e.g., the copper conductor layers 222, 224, 230) can have an initial thickness ranging from about 9 μm to 35 μm. If a copper conductor layer with increased thickness is required to reduce the resistance and enhance the thermal conductivity of the semiconductor chip laminate, then electroplating may be employed to add more copper to the copper conductor layer up to a thickness of about 100 μm. It is further noted that, in the disclosed semiconductor chip laminate, the isolation voltage between the respective semiconductor chips can be up to 5000 volts to meet the requirements of safety standards organizations such as Underwriters Laboratories (UL), Technischer Überwachungsverein (TÜV), Canadian Standards Association (CSA), or any other suitable safety standards organization.

Figures 2, 3, 4:
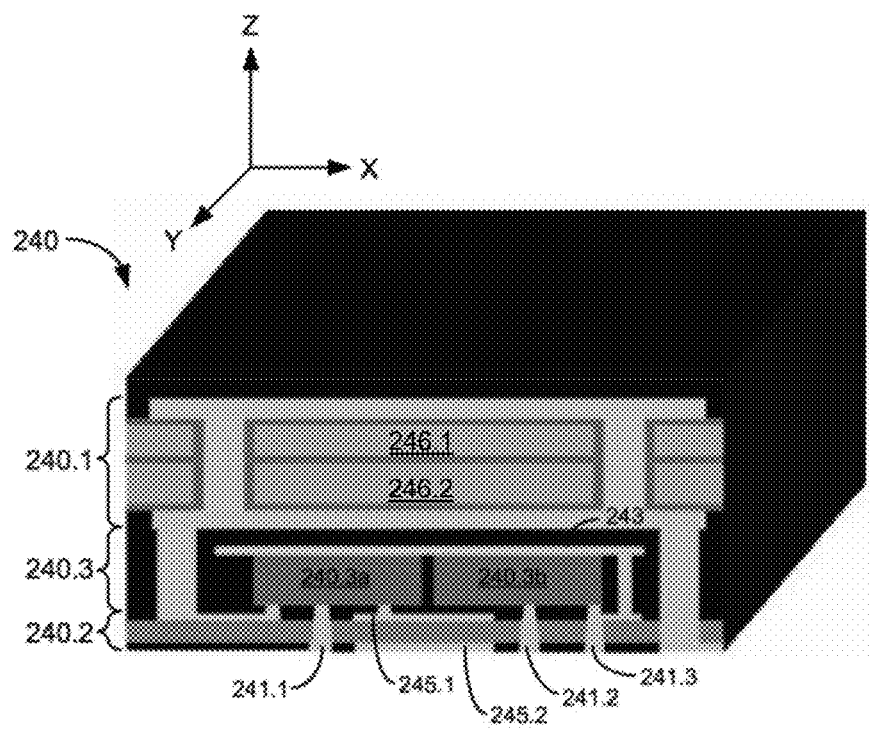
Figures 2, 3, 4:
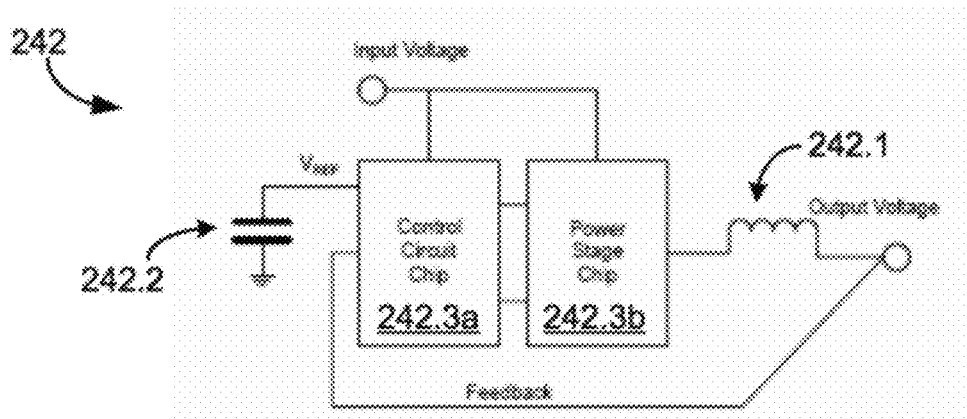
Figures 2, 3, 4:
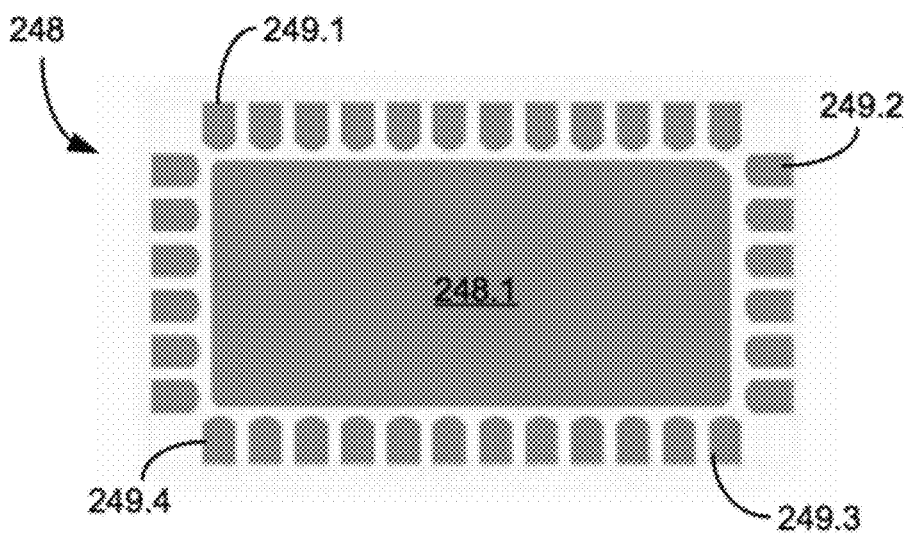
Figures 2, 3, 4:
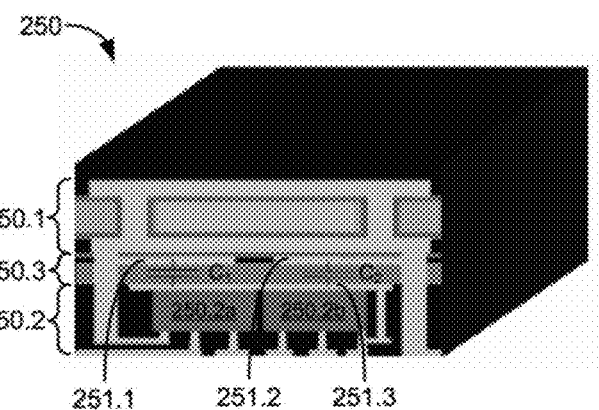
Figures 2, 3, 4:
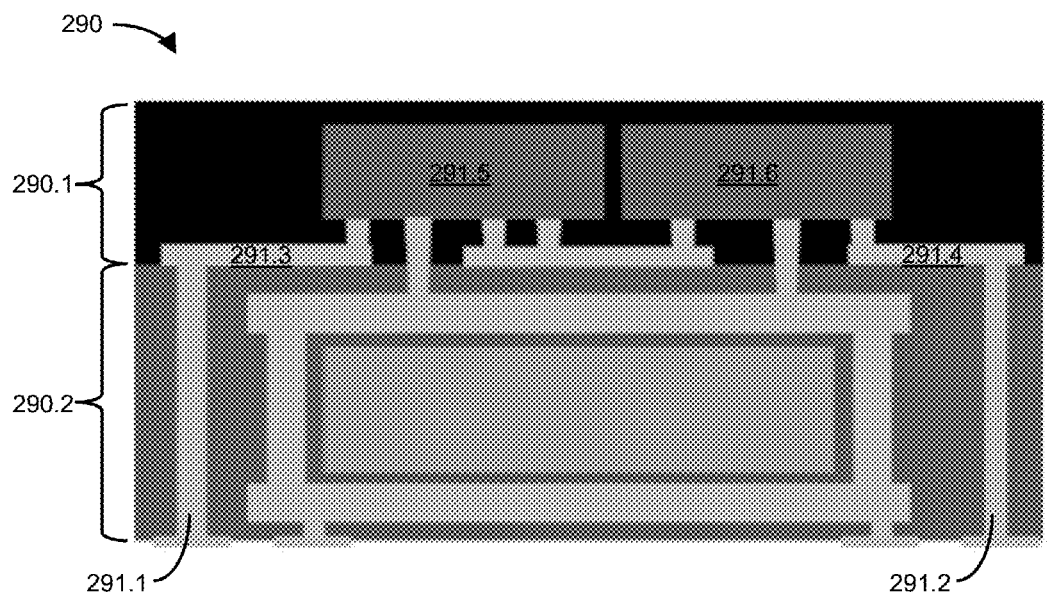
Figures 2, 3, 4:
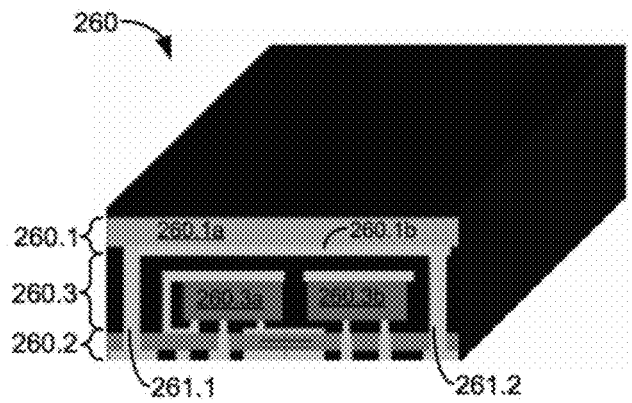
Figures 2, 3, 4:
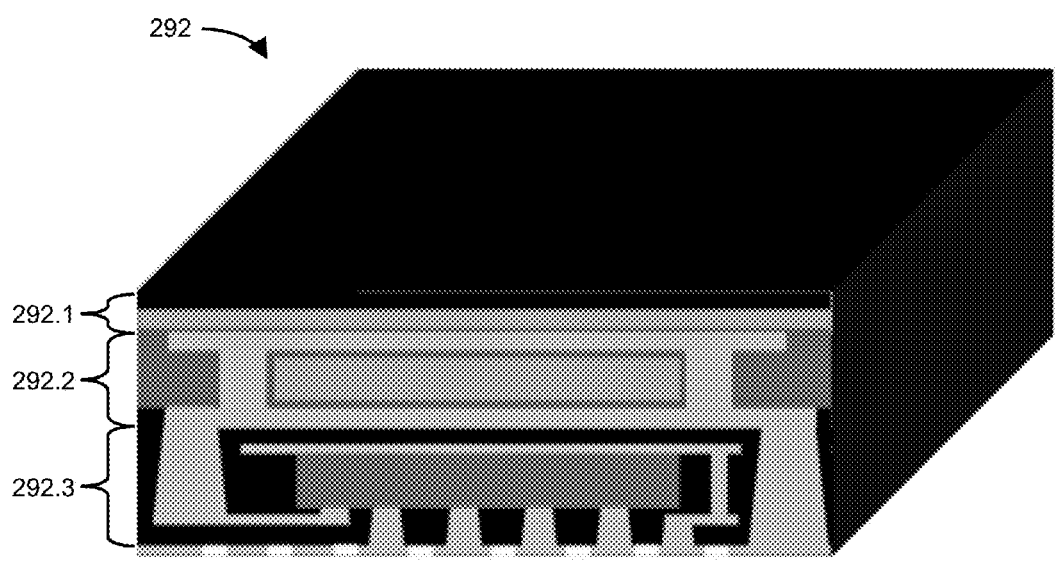
Figures 2, 3, 4:
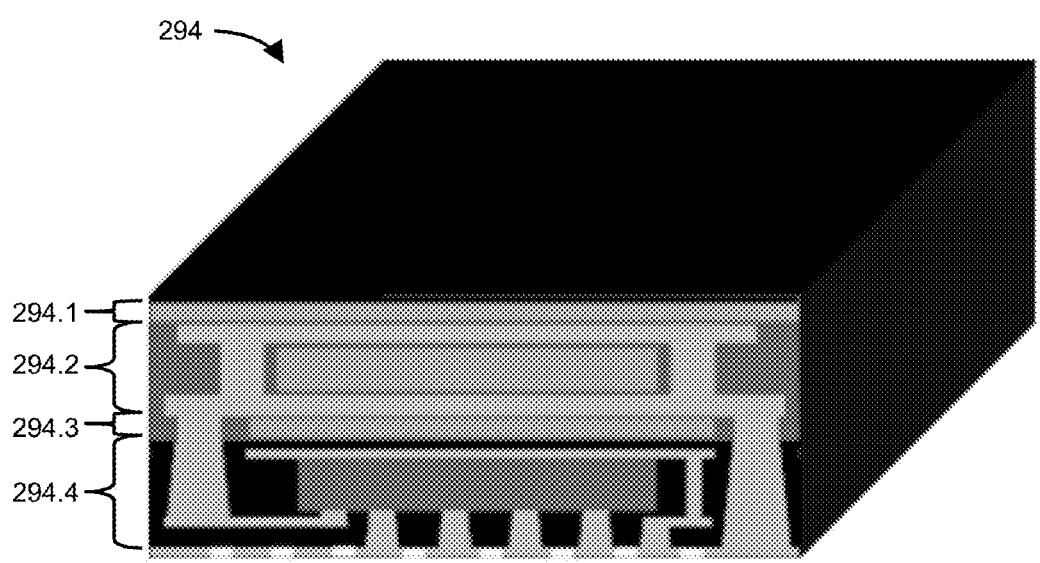

Integrating Inductive, Capacitive, Electromagnetic Shielding, and Semiconductor Chip Laminate Modules Together to Form Electronic Circuits FIG. 2-4(1) is an exemplary cross-sectional view of an electronic system 240 incorporating integrated, modular laminate structures, in accordance with the present application. As shown in FIG. 2-4(1), the electronic system 240 includes a modular inductive laminate structure 240.1, a modular capacitive laminate structure 240.2, and a modular semiconductor chip laminate structure 240.3 disposed between the modular inductive laminate structure 240.1 and the modular capacitive laminate structure 240.2. The modular inductive laminate structure 240.1, the modular capacitive laminate structure 240.2, and the modular semiconductor chip laminate structure 240.3 can be vertically integrated together under hot pressure, soldered together, or both. The bonding materials in all of the modular laminate structures 240.1-240.3, insulation materials, and substrate base materials are designed to have good compatibility with regard to adhesion and thermal expansion coefficients.

As further shown in FIG. 2-4(1), the modular inductive laminate structure 240.1 can have two or more magnetic core sheet layers 246.1, 246.2 stacked in the vertical "Z" direction. The multiple magnetic core sheet layers 246.1, 246.2 can be provided to increase the inductive coupling strength of the modular inductive laminate structure 240.1. In one embodiment, the magnetic core sheet layers 246.1, 246.2 can each have the same electromagnetic properties, including, but not limited to, permeability, loss factor, and/or frequency spectrum. In another embodiment, the magnetic core sheet layers 246.1, 246.2 can have different thicknesses, as well as different electromagnetic properties. By using different combinations of two or more magnetic core sheet layers with selected thicknesses and/or selected electromagnetic properties (e.g., selected permeability, loss factor, and/or frequency spectrum, etc.), the modular inductive laminate structure 240.1 can be provided with electromagnetic properties that are targeted to specific applications of the electronic system 240.

It is noted that the stack-up sequence of the modular inductive laminate structure 240.1, the modular capacitive laminate structure 240.2, and the modular semiconductor chip laminate structure 240.3 has essentially no constraints—any one of the respective modular laminate structures 240.1-240.3 can be disposed on the top, bottom, or middle of the vertically integrated electronic system 240. For example, the modular laminate structure that generates the most heat can be placed on the bottom of the vertically integrated structure and soldered to a printed circuit board (PCB) so that the heat can be easily conducted away from the electronic system 240.

In one embodiment, the electronic system 240 including the modular inductive laminate structure 240.1, the modular capacitive laminate structure 240.2, and the modular semiconductor chip laminate structure 240.3 can be configured to provide the functionality of a switching voltage regulator circuit 242, as depicted in FIG. 2-4(2). As shown in FIG. 2-4(2), the switching voltage regulator circuit 242 includes an inductor 242.1, a capacitor 242.2, and two semiconductor chips 242.3a, 242.3b, namely, a control circuit chip 242.3a and a power stage chip 242.3b. Within the electronic system 240 (see FIG. 2-4(1)), the inductor 242.1 can be implemented by the modular inductive laminate structure 240.1, the capacitor 242.2 can be implemented by the modular capacitive laminate structure 240.2, and the control circuit chip 242.3a and the power stage chip 242.3b can be implemented within the modular semiconductor chip laminate structure 240.3.

It is noted that the capacitor 242.2 is used to filter the reference voltage, VREF. The capacitor 242.2, as implemented by the modular capacitive laminate structure 240.2, can have a high dielectric capability that provides low impedance up to GHz frequencies, which is advantageous for low output voltage circuit designs. The control circuit chip 242.3a and the power stage chip 242.3b can be implemented within a central region of the modular semiconductor chip laminate structure 240.3, and surrounded by insulative materials such as epoxy, BT resin, mixed BT and epoxy resin or polyimide.

The control circuit chip 242.3a and the power stage chip 242.3b can each be integrated circuits (ICs) (such as ICs 240.3a, 240.3b, respectively; see FIG. 2-4(1)) or discrete devices including, but not limited to, monolithic integrated circuits (ICs), micro electro-mechanical systems (MEMS), sensors, metal-oxide semiconductor field effect transistors (MOSFETs), insulated gate bipolar transistors (IGBTs), bipolar transistors, and/or diode devices. In the event the control circuit chip 242.3a and the power stage chip 242.3b are implemented as the respective integrated circuits 240.3a, 240.3b, they can be positioned within the modular semiconductor chip laminate structure 240.3 to allow their input/output (I/O) pads to be connected to a bottom I/O layer (see, e.g., FIG. 2-4(3)) of the vertically integrated electronic system 240 through one or more vias (such as vias 241.1-241.3; see FIG. 2-4(1)). In the event the control circuit chip 242.3a and the power stage chip 242.3b are implemented using discrete devices (e.g., MOSFETs, IGBTs, diodes, etc.), the respective discrete devices can be positioned within the modular semiconductor chip laminate structure 240.3 either "face up" or "face down", whichever is more convenient for the required interconnects. The respective integrated circuits 240.3a, 240.3b can be bonded onto a copper shielding layer 243 within the modular semiconductor chip laminate structure 240.3 by using epoxy resin, which helps to reduce the thermal impedance. The bonding epoxy resin can be either electrically conductive or electrically non-conductive, as required and/or desired.

The modular capacitive laminate structure 240.2 includes two copper conductor layers 245.1, 245.2. The copper conductor layer 245.1 can include one or more copper island patterns to form one or more integrated capacitance structures. The copper conductor layer 245.1 can also function as a distribution layer, upon which routes of lines and/or traces can be etched to connect the I/O pads of the respective integrated circuits 240.3a, 240.3b to the bottom I/O layer (see FIG. 2-4(3)). Vias can also be provided from the distribution layer to the I/O pads of the respective integrated circuits 240.3a, 240.3b. To reduce the resistance of the vias and achieve increased efficiency, the vias can be filled with copper. Laser drilling can also be performed to accurately position/align the respective vias.

The bottom I/O layer of the vertically integrated electronic system 240 can also be used to implement the terminals of the modular capacitive laminate structure 240.2. If one of the terminals is to be connected to ground potential, then the bottom I/O layer can include a large exposed ground pad, e.g. at its center. FIG. 2-4(3) depicts an exemplary bottom I/O layer 248, including a large ground pad 248.1 positioned at its center, and a plurality of I/O pads positioned along its perimeter, such as I/O pads 249.1-249.4. The plurality of I/O pads along the perimeter of the bottom I/O layer 248 can be copper pads with material plated on their surfaces to make them solderable to an application PCB. The I/O pad patterns, outline, and sizes can correspond to standard semiconductor packages, such QFN, TSSOP, WLCSP, PGA, or another other suitable semiconductor package. The plurality of I/O pads along the perimeter of the bottom I/O layer 248 can be connected to the ICs 240.3a, 240.3b or to one or more internal copper layers through solid vias, which can be filled with conductive copper paste to reduce the resistance of the vias while increasing the thermal conductivity.

FIG. 2-4(4) is an exemplary cross-sectional view of another electronic system 250 incorporating integrated, modular, laminate structures, in accordance with the present application. As shown in FIG. 2-4(4), the electronic system 250 includes a modular inductive laminate structure 250.1, a modular semiconductor chip laminate structure 250.2, and a modular capacitive laminate structure 250.3 disposed between the modular inductive laminate structure 250.1 and the modular semiconductor chip laminate structure 250.2. The modular capacitive laminate structure 250.3 includes copper conductor layers 251.1-251.3 that can be patterned to form one or more capacitors, such as capacitors $C_1$, $C_2$. By positioning the modular capacitive laminate structure 250.3 in the middle of the vertically integrated electronic system 250, increased electromagnetic shielding can be provided for one or more integrated circuits (e.g., ICs 250.2a, 250.2b) included in the modular semiconductor chip laminate structure 250.2.

FIG. 2-4(5) is an exemplary cross-sectional view of still another electronic system 290 incorporating integrated, modular, laminate structures, in accordance with the present application. As shown in FIG. 2-4(5), the electronic system 290 includes a modular semiconductor chip laminate structure 290.1 and a modular inductive laminate structure 290.2. Whereas the modular inductive laminate structure 250.1 was disposed on top of or above the modular capacitive laminate structure 250.3 and the modular semiconductor chip laminate structure 250.2 in the electronic system 250 of FIG. 2-4(4), the modular inductive laminate structure 290.2 is disposed underneath or below the modular semiconductor chip laminate structure 290.1 in the electronic system 290 of FIG. 2-4(5). The modular inductive laminate structure 290.2 includes a plurality of vias (such as vias 291.1, 291.2) for interconnecting electrical nodes of the modular semiconductor chip laminate structure 290.1 to I/O pads of the electronic system 290. For example, the plurality of vias (e.g., the vias 291.1, 291.2) can be formed with electroplated copper. Further, one or more portions (such as portions 291.3, 291.4) of the interconnections between the electrical nodes of the modular semiconductor chip laminate structure 290.1 and the I/O pads of the electronic system 290 can be distributed at least partially across one or both of the laminate structures 290.1, 290.2. For example, the interconnections between the modular semiconductor chip laminate structure 290.1, the modular inductive laminate structure 290.2, and/or the I/O pads can be formed by drilling one or more via holes using a laser or any other suitable drilling device, and electroplating copper on the walls of the via holes.

It is noted that bumps can also be electroplated, sputtered, or printed, using any suitable process, on the surface of the modular inductive laminate structure 290.2 to form at least some of the interconnections with the modular semiconductor chip laminate structure 290.1 and/or the I/O pads. For example, such bumps can be made with solder, gold, copper, or any other suitable material that can be bonded to the surface of the modular inductive laminate structure 290.2, possibly with the help of electro-conductive paste or solder paste. The modular semiconductor chip laminate structure 290.1 can also be directly bonded, soldered, or otherwise connected to the modular inductive laminate structure 290.2 (or any other suitable modular laminate structure) disposed underneath or below (and/or on top of or above) it. For example, such connections with other modular laminate structures can be made by placing solderable bumps and/or solderable pillars or pads of any suitable bonding-compliant metal at suitable locations on surfaces of one or more semiconductor chips 291.5, 291.6 included in the modular semiconductor chip laminate structure 290.1. Further, after making such connections, a cap of any suitable semiconductor packaging resin can be molded on top of the electronic system 290 and/or around the semiconductor chips 291.5, 291.6 within the modular semiconductor chip laminate structure 290.1.

By positioning the modular inductive laminate structure 290.2 underneath or below the modular semiconductor chip laminate structure 290.1 in the electronic system 290 of FIG. 2-4(5), the plurality of vias (e.g., the vias 291.1, 291.2) interconnecting electrical nodes of the modular semiconductor chip laminate structure 290.1 to the I/O pads of the electronic system 290 can be used to transfer heat away from the laminate structure 290.1 with increased efficiency. Further, by distributing portions (e.g., the portions 291.3, 291.4) of the interconnections between the modular semiconductor chip laminate structure 290.1 and the I/O pads at least partially across one or both of the laminate structures 290.1, 290.2, improved thermal balance characteristics can be achieved.

FIG. 2-4(6) is an exemplary cross-sectional view of yet another electronic system 260 incorporating integrated, modular, laminate structures, in accordance with the present application. As shown in FIG. 2-4(6), the electronic system 260 includes a modular electromagnetic shielding laminate structure 260.1, a modular capacitive laminate structure 260.2, and a modular semiconductor chip laminate structure 260.3 disposed between the modular electromagnetic shielding laminate structure 260.1 and the modular capacitive laminate structure 260.2. When an electronic system operates in an environment that potentially experiences high electromagnetic noise or microwaves produced by automotive equipment, medical equipment, testing equipment, etc., sufficient electromagnetic shielding is generally required to allow the electronic system to function properly. For example, some MEMS and/or sensor devices (e.g., barometers, tilt sensors, accelerometers, gyro sensors, wireless sensors) operate with small sensing signals, and therefore require sufficient shielding for proper operation.

In the electronic system 260 of FIG. 2-4(6), such required shielding can be provided by the modular electromagnetic shielding laminate structure 260.1 disposed at the top of the vertically integrated electronic system 260. As shown in FIG. 2-4(6), the modular electromagnetic shielding laminate structure 260.1 includes a magnetic core sheet layer 260.1a, and a copper conductor layer 260.1b. The modular electromagnetic shielding laminate structure 260.1 can absorb electromagnetic noise coming from outside of the electronic system 260. The high permeability of the magnetic core sheet layer 260.1a provides a low resistance path for flux flow and prevents the flux from penetrating deeper inside the electronic system 260.

As further shown in FIG. 2-4(6), the copper conductor layer 260.1b can be connected to vias 261.1, 261.2 that pass through the vertically integrated electronic system 260 to the bottom I/O layer (see, e.g., FIG. 2-4(3)). The vias 261.1, 261.2 can be terminated with ground pins or the I/O pads of the electronic system 260. The copper conductor layer 260.1b, the vias 261.1, 261.2, and the I/O pads, all of which can be connected to ground, effectively form a closed chamber that shields against electromagnetic noise and/or external signals, preventing the semiconductor, sensor, or MEMS chips (e.g., ICs 260.3a, 260.3b; see FIG. 2-4(6)) disposed inside the closed chamber from being exposed to unwanted electromagnetic interference. It is noted that the modular capacitive laminate structure 260.2 can be connected to the supply voltage of the ICs 260.3a, 260.3b to increase the power supply rejection ratio.

FIG. 2-4(7) is an exemplary cross-sectional view of a further electronic system 292 incorporating integrated, modular, laminate structures, in accordance with the present application. As shown in FIG. 2-4(7), the electronic system 292 includes a modular electromagnetic shielding laminate structure 292.1, a modular semiconductor chip laminate structure 292.3, and a modular inductive laminate structure 292.2 disposed between the modular electromagnetic shielding laminate structure 292.1 and the modular semiconductor chip laminate structure 292.3. The modular electromagnetic shielding laminate structure 292.1 disposed on top of or above the modular inductive laminate structure 292.2 can help to prevent the electromagnetic field produced by the modular inductive laminate structure 292.2 from leaking to the exterior of the electronic system 292. The modular electromagnetic shielding laminate structure 292.1 can also help to increase the electromagnetic coupling of the coil winding of the modular inductive laminate structure 292.2, thereby increasing the inductance of the laminate structure 292.2. As the thickness of the modular electromagnetic shielding laminate structure 292.1 is increased, the inductance of the laminate structure 292.2 is also increased.

FIG. 2-4(8) is an exemplary cross-sectional view of an electronic system 294 that includes a modular semiconductor chip laminate structure 294.4, a modular inductive laminate structure 294.2 disposed above the modular semiconductor chip laminate structure 294.4, a first modular electromagnetic shielding laminate structure 294.1 disposed on top of or above the modular inductive laminate structure 294.2, and a second modular electromagnetic shielding laminate structure 294.3 disposed underneath or below the modular inductive laminate structure 294.2. By providing the first and second modular electromagnetic shielding laminate structures 294.1, 294.3 above and below, respectively, the modular inductive laminate structure 294.2 in the electronic system 294, reduced electromagnetic field leakage, as well as increased inductance of the laminate structure 294.2, can be achieved.

Exemplary Applications of Integrated Laminate Modules

The disclosed inductive, capacitive, electromagnetic shielding, and semiconductor chip laminate modular structures can be integrated together to form electronic circuits for use in a wide variety of target applications, including, but not limited to, the representative target applications depicted in FIGS. 3-1 to 3-12. In each of the representative target applications of FIGS. 3-1 to 3-12, semiconductor chip(s), inductor(s), capacitor(s), and/or electromagnetic shielding can be implemented using the semiconductor chip, inductive, capacitive, and/or electromagnetic shielding laminate modular structures disclosed herein, and the respective laminate modular structures can be integrated (e.g., vertically) to form the electronic circuits required in the respective target applications.

FIG. 3-1 depicts a schematic diagram for laminated system integration of a voltage regulator system 300 (e.g., a linear or PWM switching type of voltage regulator system), which includes an integrated voltage regulator chip 300.1 and an integrated inductor $L_0$. It is noted that the equivalent inductance and coil resistance of a modular inductive laminate structure (as well as the equivalent ESR and capacitance of a modular capacitive laminate structure) can be measured device-by-device during fabrication, and the measurement values can be used in a semiconductor chip (e.g., the voltage regulator chip 300.1) to optimize the control of the overall system of which the voltage regulator system 300 is a part. For example, the coil resistance of the modular inductive laminate structure can be used to obtain a current measurement value.

FIG. 3-2 depicts a schematic diagram for laminated system integration of a step-down voltage regulation converter 302 (also referred to as a "buck converter"), which includes an integrated voltage regulator chip 302.1, an integrated inductor $L_0$, and an integrated capacitor $C_0$, which can have an integrated capacitance in the range of 100 pF to 10 nF. The laminated system integration of the step-down voltage regulation converter 302 can be employed in low power designs for wearable electronic devices, energy harvesting devices, etc.

FIG. 3-3 depicts a schematic diagram for laminated system integration of a step-down voltage regulation converter 304 that includes a control circuit chip 304.1, a high-side MOSFET chip $T_0$, a low-side MOSFET chip $T_1$, and an inductor $L_0$. The control circuit chip 304.1, the high-side MOSFET chip $T_0$, and the low-side MOSFET chip $T_1$ can each be implemented in the same semiconductor chip laminate modular structure. The high-side MOSFET chip $T_0$ and the low-side MOSFET chip $T_1$ can each be positioned within the semiconductor chip laminate modular structure so that its gate terminals either "face up" or "face down" for conveniently connecting the respective gate terminals to the control circuit chip 304.1.

FIG. 3-4 depicts a schematic diagram for laminated system integration of a step-down voltage regulation converter 306 that has a high-side MOSFET switch $T_0$ integrated on a control circuit chip 306.1. The step-down voltage regulation converter 306 includes the high-side MOSFET switch $T_0$, the control circuit chip 306.1, an inductor $L_0$.

Figures 1, 3:
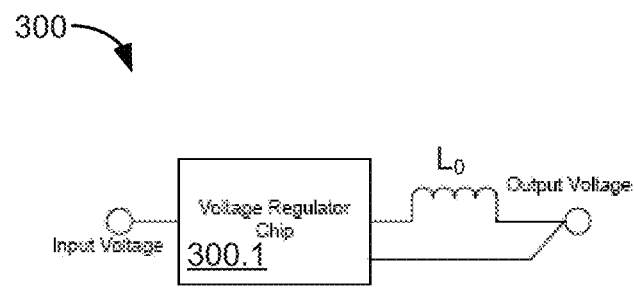
Figures 2, 3:
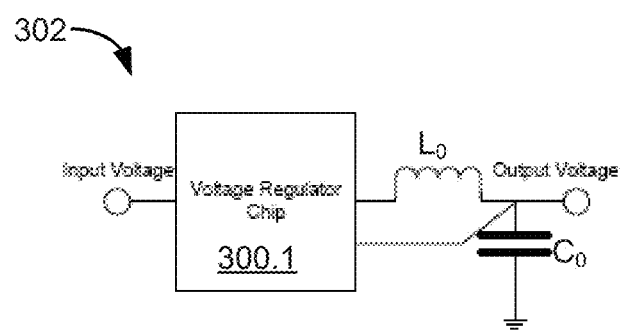
Figure 3:
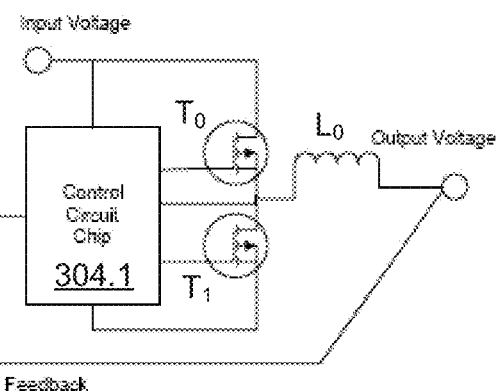
Figures 3, 4:
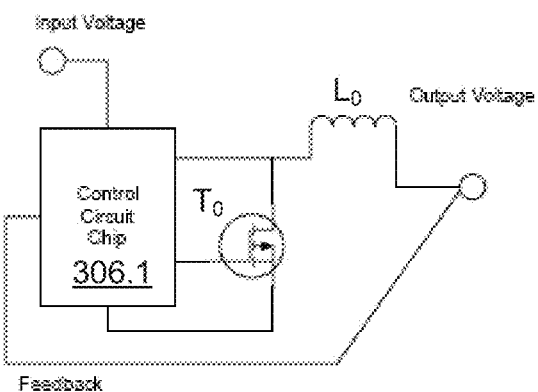
Figures 3, 4, 5:
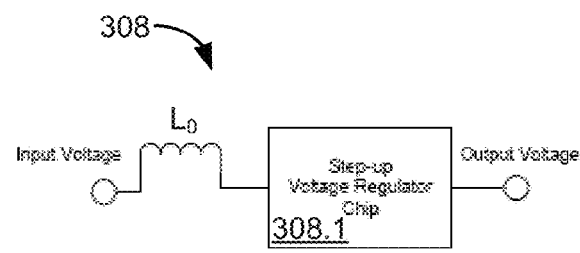
Figures 3, 4, 5, 6:
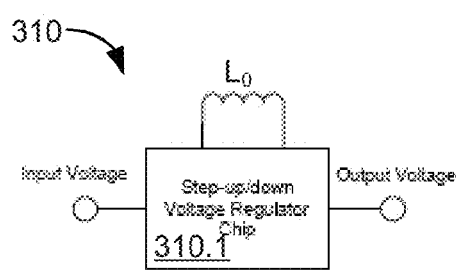
Figures 3, 4, 5, 6, 7:
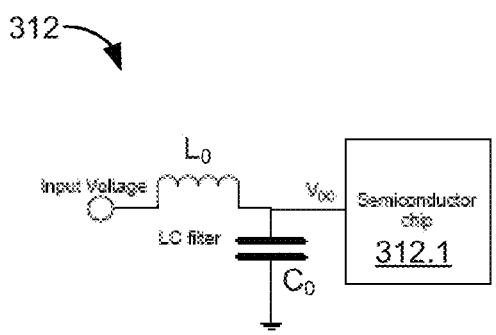
Figures 3, 4, 5, 6, 7, 8:
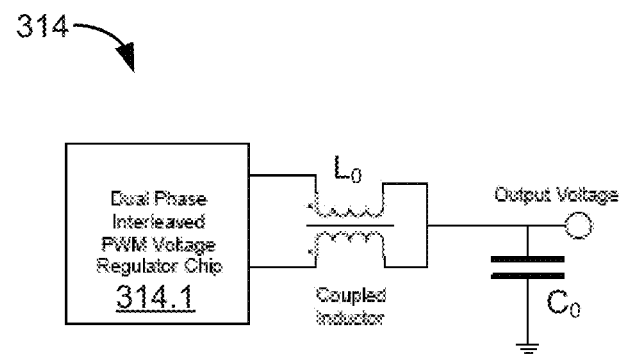
Figures 3, 4, 5, 6, 7, 8, 9:
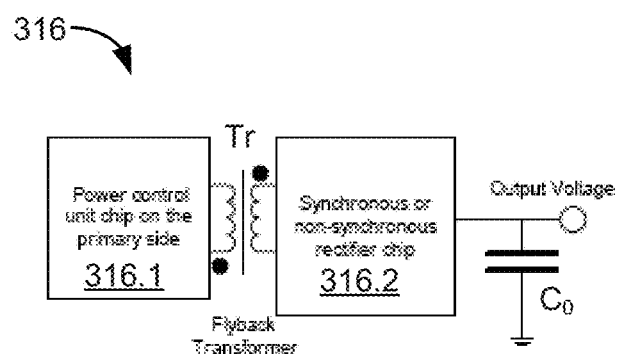
Figures 3, 4, 5, 6, 7, 8, 9, 10:
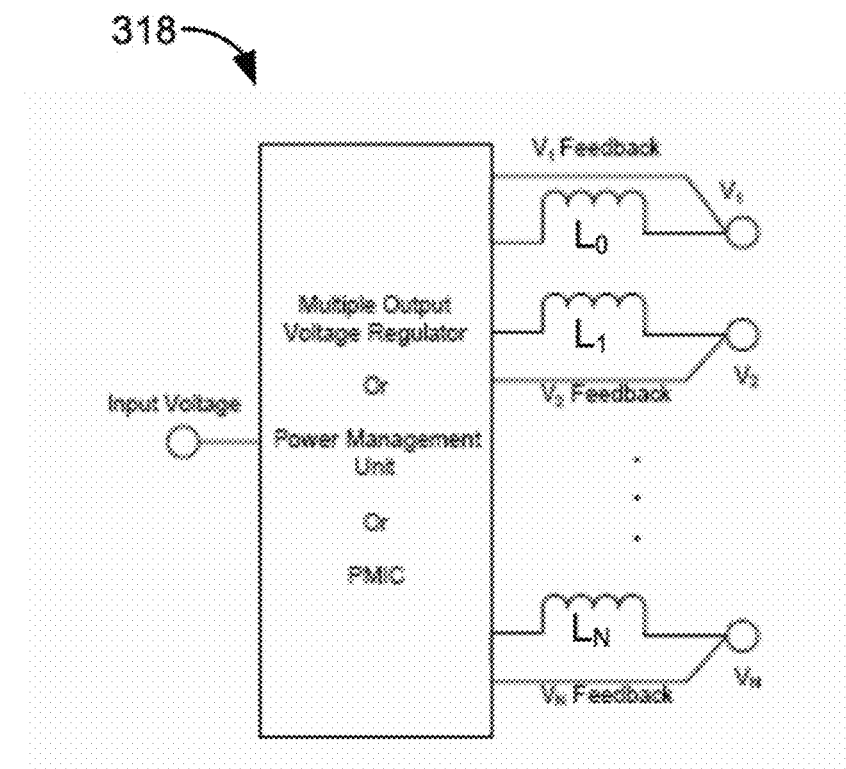
Figures 3, 4, 5, 6, 7, 8, 9, 10, 11:
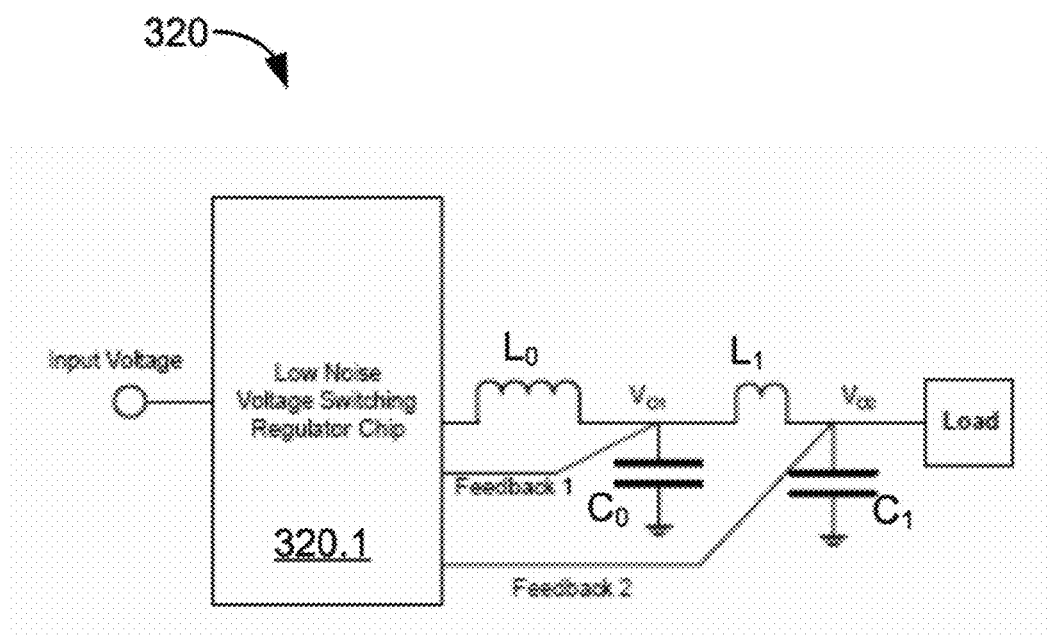
Figures 3, 4, 5, 6, 7, 8, 9, 10, 11:
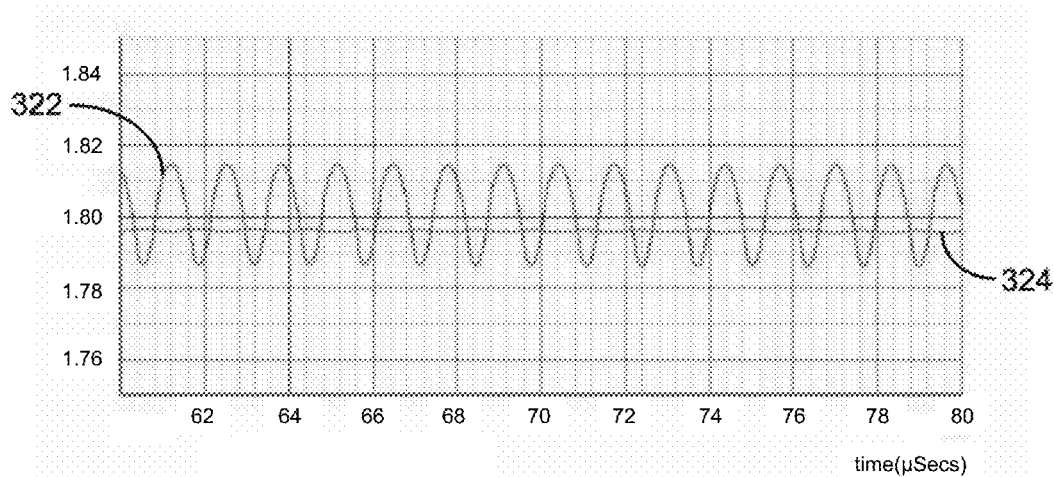
Figures 3, 4, 5, 6, 7, 8, 9, 10, 11:
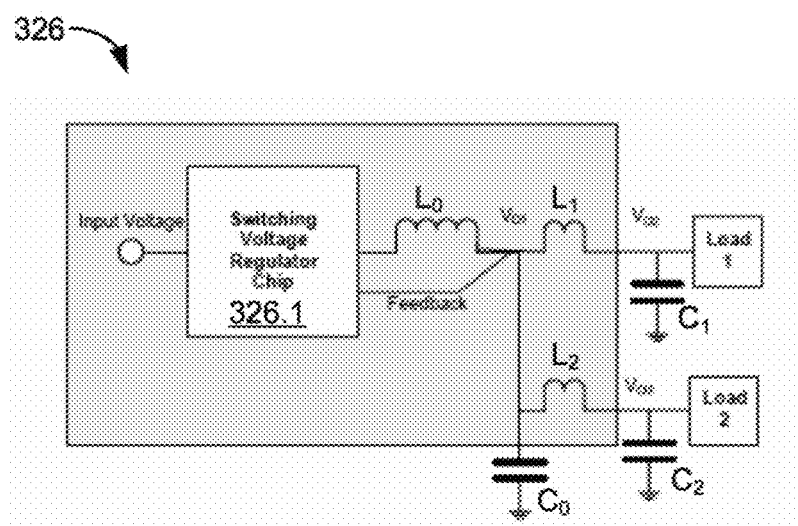
Figures 3, 4, 5, 6, 7, 8, 9, 10, 11, 12:
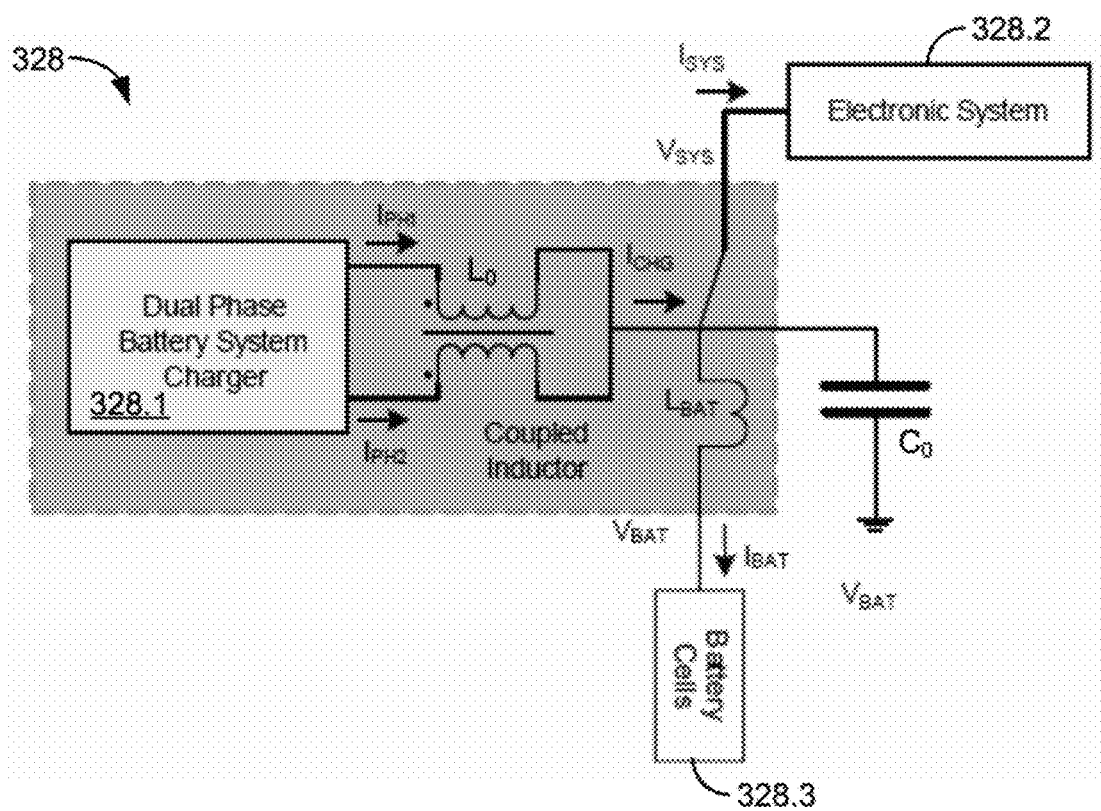
Figure 4:
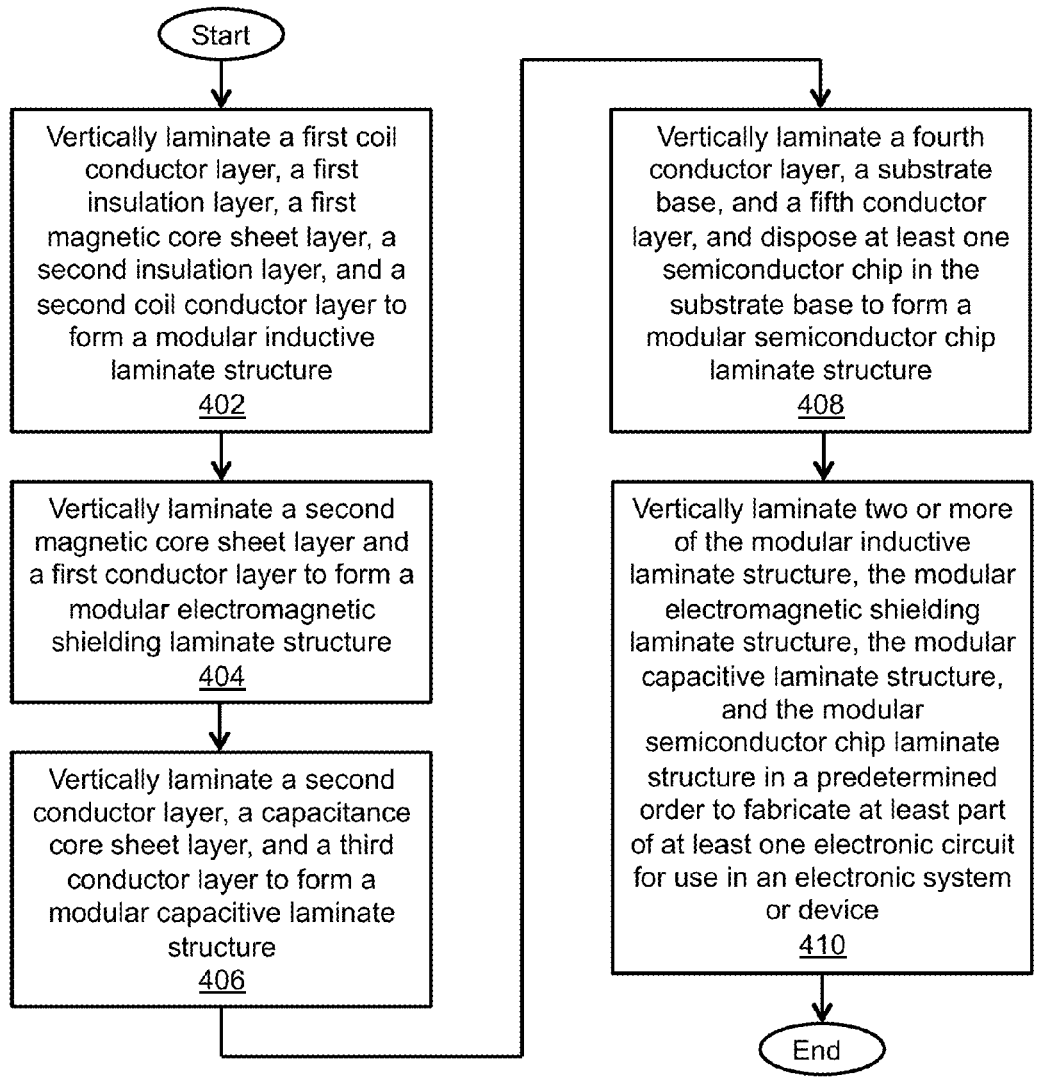

FIG. 3-5 depicts a schematic diagram for laminated system integration of a step-up voltage regulation converter 308 (also referred to as a "boost converter"), including a step-up voltage regulator chip 308.1, and an inductor $L_0$, which can be directly connected to the input voltage.

FIG. 3-6 depicts a schematic diagram for laminated system integration of a buck-boost voltage converter 310, including a step-up/step-down voltage regulator chip 310.1, and an inductor L0, which can be directly connected to MOSFET switches implemented within the step-up/step-down voltage regulator chip 310.1.

FIG. 3-7 depicts a schematic diagram for laminated system integration of an LC filter for a supply voltage of a semiconductor chip 312.1, which can correspond to an analog-to-digital converter (ADC), a digital-to-analog converter (DAC), one or more operational amplifiers, logic circuitry, a digital signal processor (DSP), a microcontroller, a field programmable gate array (FPGA), an application specific integrated circuit (ASIC), a MEMS, a sensor, etc. The LC filter includes an inductor $L_0$ and a capacitor $C_0$, each of which can be integrated within the modular laminate structure either on top of or underneath the semiconductor chip 312.1.

FIG. 3-8 depicts a schematic diagram for laminated system integration of a dual-phase interleaved voltage regulator 314, including a dual-phase interleaved PWM voltage regulator chip 314.1, a coupled inductor $L_0$ with two windings, and a capacitor $C_0$.

FIG. 3-9 depicts a schematic diagram for laminated system integration of a flyback converter system 316, including a power control unit chip 316.1, a synchronous or non-synchronous rectifier chip 316.2, a flyback transformer Tr, and a capacitor $C_0$. In the laminated system integration of the flyback converter system 316, the power control unit chip 316.1 is integrated on the primary side of the transformer Tr, and the rectifier chip 316.2 is integrated on the secondary side of the transformer Tr.

FIG. 3-10 depicts a schematic diagram for laminated system integration of a multiple output voltage regulator, a power management unit (PMU), or a power management integrator circuit (PMIC) 318, in which each voltage output channel 1-N of the voltage regulator, PMU, or PMIC 318 has its own associated inductor $L_0$-$L_N$, respectively. The respective inductors $L_0$-$L_N$ can be laminated using the same magnetic core sheet layer. To avoid electromagnetic field interference, some space (e.g., from 5 μm to 300 μm) can be etched out between the respective inductors $L_0$-$L_N$ in the laminated system integration, and filled with dielectric material such as epoxy or BT.

FIG. 3-11(1) depicts a schematic diagram for laminated system integration of a low noise voltage delivery system 320, including two inductors $L_0$, $L_1$ and two capacitors $C_0$, $C_1$ integrated to form a cascaded, 2-stage LC filter (including an $L_0C_0$ filter in the $1^{st}$ stage, and an $L_1C_1$ filter in the $2^{nd}$ stage). As shown in the diagram of FIG. 3-11(2), the output $V_{O1}$ (see reference numeral 322) of the $L_0C_0$ filter in the $1^{st}$ stage has voltage ripples in a range of several tens of millivolts (mV), and the output $V_{O2}$ (see reference numeral 324) of the $L_1C_1$ filter in the $2^{nd}$ stage has voltage ripples reduced to less than a few microvolts (μV). The low noise voltage delivery system 320 is configured to provide supply voltages for devices that are sensitive to voltage ripples and noise, such as phase-locked loops (PLLs), high speed clocks, etc., as well as precision analog and digital circuits such as ADCs, DACs, amplifiers, MEMS, sensors, etc. If multiple, low noise voltage outputs are required, additional inductors (e.g., $L_0$, $L_1$, $L_2$ . . . ) can be included in the laminated system integration, as shown in the low noise voltage delivery system 326 of FIG. 3-11(3).

FIG. 3-12 depicts a schematic diagram for laminated system integration of an integrated system battery charger 328, including a switching battery charger IC 328.1, a dual-phase coupled inductor $L_0$, and an inductor $L_{BAT}$ for filtering a battery charging current $I_{CHG}$. The integrated system battery charger 328 is configured to provide a system current $I_{SYS}$ to a main electronic system 328.2 (e.g., a notebook computer, a tablet computer, a smartphone), and a filtered battery current $I_{BAT}$ to one or more rechargeable battery cells 328.3. The illustrated embodiment of the integrated system battery charger 328 employs an external capacitor $C_0$, which, alternatively, can be made to be a part of the laminated system integration. The laminated inductor $L_{BAT}$ connected to the battery cells 328.3 not only filters the battery charging current $I_{CHG}$ in both a charging mode and a discharging mode, but it can also serve as a battery current sense by measuring the voltage drop across the resistance of its copper coils. With appropriate trimming designed in the switching battery charger IC 328.1, the sense accuracy of the battery current $I_{BAT}$ can be at least +/−1%. Such use of the laminated inductor $L_{BAT}$ can eliminate a traditional battery current sense power resistor, increasing the charging power efficiency and saving PCB space. Moreover, the dual-phase coupled inductor $L_O$ can serve as a phase current sense by measuring the voltage drop across the phase resistance of its coils. With further appropriate trimming designed in the switching battery charger IC 328.1, the phase sense accuracy can be at least +/−1%. It is noted that the sum of the two phase currents $I_{PH1}$, $I_{PH2}$ provided by the switching battery charger IC 328.1 corresponds to the total current $I_{CHG}$ of the integrated system battery charger 328. The difference between the charging current $I_{CHG}$ and the battery current $I_{BAT}$ is equal to the system current $I_{SYS}$. The three currents $I_{CHG}$, $I_{BAT}$, and $I_{SYS}$ can be sensed with high accuracy without using any dedicated sensing components, obviating the need for current sense resistors, reducing the parts count, and enhancing the current sense accuracy.

An exemplary method of fabricating an electronic circuit for use in an electronic system or device is described below with reference to FIG. 4. As depicted in block 402, a first coil conductor layer, a first insulation layer, a first magnetic core sheet layer, a second insulation layer, and a second coil conductor layer are vertically laminated to form a modular inductive laminate structure. As depicted in block 404, a second magnetic core sheet layer and a first conductor layer are vertically laminated to form a modular electromagnetic shielding laminate structure. As depicted in block 406, a second conductor layer, a capacitance core sheet layer, and a third conductor layer are vertically laminated to form a modular capacitive laminate structure. As depicted in block 408, a fourth conductor layer, a substrate base, and a fifth conductor layer are vertically laminated, and at least one semiconductor chip is disposed in the substrate base to form a modular semiconductor chip laminate structure. As depicted in block 410, two or more of the modular inductive laminate structure, the modular electromagnetic shielding laminate structure, the modular capacitive laminate structure, and the modular semiconductor chip laminate structure are vertically laminated in a predetermined order to fabricate at least part of the electronic circuit for use in the electronic system or device.

It will be appreciated by those of ordinary skill in the art that modifications to and variations of the above-described systems and methods may be made without departing from the inventive concepts disclosed herein. Accordingly, the invention should not be viewed as limited except as by the scope and spirit of the appended claims.

What is claimed is:

1. An integrated laminate structure for use in an electronic system or device, comprising:
   a plurality of modular laminate structures including a modular inductive laminate structure, and one or more of a modular capacitive laminate structure, a modular semiconductor chip laminate structure, and a modular electromagnetic shielding laminate structure,
   wherein the modular inductive laminate structure includes a first coil conductor layer, a first insulation layer vertically laminated on the first coil conductor layer, a magnetic core sheet layer vertically laminated on the first insulation layer, a second insulation layer vertically laminated on the magnetic core sheet layer, and a second coil conductor layer vertically laminated on the second insulation layer, the first coil conductor layer including a first plurality of etched coil conductor portions, and the second coil conductor layer including a second plurality of etched coil conductor portions,
   wherein the modular inductive laminate structure further includes a plurality of vias formed through the magnetic core sheet layer to interconnect the first coil conductor layer and the second coil conductor layer, the first and second pluralities of etched coil conductor portions in combination with the plurality of vias forming multiple turns of one or more coil windings wrapped around the magnetic core sheet layer,
   wherein one or more of the plurality of vias include a first hole extending through the magnetic core sheet layer from the first coil conductor layer to the second coil conductor layer, an insulative material disposed within the first hole, and a second hole smaller than the first hole formed through the insulative material from the first coil conductor layer to the second coil conductor layer, the second hole having an electroplated sidewall, and
   wherein the plurality of modular laminate structures are vertically laminated together to form at least part of at least one electronic circuit within the electronic system or device.

2. The integrated laminate structure of claim 1 wherein the magnetic core sheet layer includes a first magnetic core sheet sub-layer and a second magnetic core sheet sub-layer laterally disposed and spaced apart from one another to form a pair of inductive components within the modular inductive laminate structure.

3. The integrated laminate structure of claim 1 wherein the modular inductive laminate structure includes two or more modular inductive laminate sub-structures laterally disposed relative to one another.

4. The integrated laminate structure of claim 1 wherein the modular electromagnetic shielding laminate structure includes a magnetic core sheet layer and a conductor layer vertically laminated within the modular electromagnetic shielding laminate structure.

5. The integrated laminate structure of claim 1 wherein the modular capacitive laminate structure includes a first conductor layer, a capacitance core sheet layer vertically laminated on the first conductor layer, and a second conductor layer vertically laminated on the capacitance core sheet layer.

6. The integrated laminate structure of claim 5 wherein the first conductor layer includes a first conductor sub-layer and a second conductor sub-layer laterally disposed and spaced apart from one another, and wherein the second conductor layer includes a third conductor sub-layer and a fourth conductor sub-layer laterally disposed and spaced apart from one another, the first conductor sub-layer, the capacitance core sheet layer, and the third conductor sub-layer forming a first capacitive component structure, and the second conductor sub-layer, the capacitance core sheet layer, and the fourth conductor sub-layer forming a second capacitive component structure.

7. The integrated laminate structure of claim 1 wherein the modular semiconductor chip laminate structure includes a first conductor layer, a substrate base vertically laminated on the first conductor layer, and a second conductor layer vertically laminated on the substrate base.

8. The integrated laminate structure of claim 7 wherein the modular semiconductor chip laminate structure further includes one or more semiconductor chips disposed within the substrate base.

9. The integrated laminate structure of claim 8 wherein the one or more semiconductor chips include one or more of a monolithic integrated circuit (IC), a micro electro-mechanical system (MEMS), a sensor, a metal-oxide semiconductor field effect transistor (MOSFET), an insulated gate bipolar transistor (IGBT), a bipolar transistor, and a diode.

10. The integrated laminate structure of claim 8 wherein the modular semiconductor chip laminate structure further includes one or more conductor layers disposed in one or more upper and lower regions of the substrate base, and one or more vias interconnecting at least one of the semiconductor chips to at least one of the conductor layers.

11. The integrated laminate structure of claim 1 further comprising:
an input/output (I/O) layer,
wherein the plurality of modular laminate structures includes the modular semiconductor chip laminate structure and the modular inductive laminate structure, one or more of the modular semiconductor chip laminate structure and the modular inductive laminate structure being connected to the I/O layer.

12. The integrated laminate structure of claim 11 wherein the modular semiconductor chip laminate structure and the modular inductive laminate structure are vertically laminated together such that the modular inductive laminate structure is disposed between the modular semiconductor chip laminate structure and the I/O layer.

13. The integrated laminate structure of claim 11 wherein the modular semiconductor chip laminate structure and the modular inductive laminate structure are vertically laminated together such that the modular semiconductor chip laminate structure is disposed between the modular inductive laminate structure and the I/O layer.

14. The integrated laminate structure of claim 1 further comprising:
an input/output (I/O) layer,
wherein the plurality of modular laminate structures includes the modular electromagnetic shielding laminate structure and the modular semiconductor chip laminate structure, one or more of the modular electromagnetic shielding laminate structure and the modular semiconductor chip laminate structure being connected to the I/O layer.

15. The integrated laminate structure of claim 14 wherein the modular electromagnetic shielding laminate structure and the modular semiconductor chip laminate structure are vertically laminated together such that the modular semiconductor chip laminate structure is disposed between the modular electromagnetic shielding laminate structure and the I/O layer.

16. The integrated laminate structure of claim 15 wherein the modular electromagnetic shielding laminate structure includes a magnetic core sheet layer and a conductor layer, wherein the integrated laminate structure further comprises:
one or more vias interconnecting the conductor layer of the modular electromagnetic shielding laminate structure to the I/O layer, and
wherein the conductor layer, the one or more vias, and the I/O layer form an electromagnetic shielding chamber, the modular semiconductor chip laminate structure being disposed within the electromagnetic shielding chamber.

17. The integrated laminate structure of claim 1 further comprising:
an input/output (I/O) layer,
wherein the plurality of modular laminate structures includes the modular electromagnetic shielding laminate structure and the modular inductive laminate structure, one or more of the modular electromagnetic shielding laminate structure and the modular inductive laminate structure being connected to the I/O layer.

18. The integrated laminate structure of claim 17 wherein the modular electromagnetic shielding laminate structure and the modular inductive laminate structure are vertically laminated together such that the modular inductive laminate structure is disposed between the modular electromagnetic shielding laminate structure and the I/O layer.

19. The integrated laminate structure of claim 18 further comprising:
a second modular electromagnetic shielding laminate structure,
wherein the modular electromagnetic shielding laminate structure, the modular inductive laminate structure, and the second modular electromagnetic shielding laminate structure are vertically laminated together such that the second modular electromagnetic shielding laminate structure is disposed between the modular inductive laminate structure and the I/O layer.

20. The integrated laminate structure of claim 1 further comprising:
an input/output (I/O) layer,
wherein the plurality of modular laminate structures includes the modular semiconductor chip laminate structure and the modular capacitive laminate structure, one or more of the modular semiconductor chip laminate structure and the modular capacitive laminate structure being connected to the I/O layer.

21. The integrated laminate structure of claim 20 wherein the modular semiconductor chip laminate structure and the modular capacitive laminate structure are vertically laminated together such that the modular semiconductor chip laminate structure is disposed between the modular capacitive laminate structure and the I/O layer.

22. The integrated laminate structure of claim 20 wherein the modular semiconductor chip laminate structure and the modular capacitive laminate structure are vertically laminated together such that the modular capacitive laminate structure is disposed between the modular semiconductor chip laminate structure and the I/O layer.

23. The integrated laminate structure of claim 22 wherein the modular capacitive laminate structure includes a plurality of conductor layers, at least one of the plurality of conductor layers being configured as a distribution layer for interconnecting the modular semiconductor chip laminate structure and the I/O layer.

24. The integrated laminate structure of claim 1 wherein the at least one electronic circuit is at least part of a linear voltage regulator, a step-down voltage regulation converter, a step-up voltage regulation converter, a buck-boost voltage converter, a supply voltage filter, a dual-phase interleaved voltage regulator, a flyback converter, a multiple output voltage regulator, a multi-stage inductor-capacitor filter, a power management unit (PMU), a power management integrator circuit (PMIC), a low noise voltage delivery system, or an integrated system battery charger.

25. The integrated laminate structure of claim 1 wherein each of the plurality of vias further includes conductive copper paste disposed within the second hole.

26. The integrated laminate structure of claim 1 wherein one or more of the first insulation layer and the second insulation layer include a blend of bismaleimide-triazine (BT) and epoxy resin.

27. An integrated laminate structure for use in an electronic system or device, comprising:
a plurality of modular laminate structures including a modular inductive laminate structure, and one or more of a modular capacitive laminate structure, a modular semiconductor chip laminate structure, and a modular electromagnetic shielding laminate structure,
wherein the modular inductive laminate structure includes a first coil conductor layer, a first insulation layer vertically laminated on the first coil conductor layer, a first magnetic core sheet layer vertically laminated on the first insulation layer, a second insulation layer vertically laminated on the first magnetic core sheet layer, a second magnetic core sheet layer vertically laminated on the second insulation layer, a third insulation layer vertically laminated on the second magnetic core sheet layer, and a second coil conductor layer vertically laminated on the third insulation layer, and wherein the plurality of modular laminate structures are vertically laminated together to form at least part of at least one electronic circuit within the electronic system or device.

\* \* \* \* \*